US012777775B2

(12) United States Patent
Kim et al.

(10) Patent No.: US 12,777,775 B2
(45) Date of Patent: Oct. 27, 2026

(54) DISPLAY DEVICE

(71) Applicant: Samsung Display Co., LTD., Yongin-si (KR)

(72) Inventors: Dong Woo Kim, Yongin-si (KR); Min Gyeong Shin, Yongin-si (KR); Won Jun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 373 days.

(21) Appl. No.: 18/395,296

(22) Filed: Dec. 22, 2023

(65) Prior Publication Data

US 2024/0237397 A1 Jul. 11, 2024

(30) Foreign Application Priority Data

Jan. 5, 2023 (KR) ........................ 10-2023-0001837

(51) Int. Cl.
*H10K 59/121* (2023.01)
*H10K 59/122* (2023.01)
(Continued)

(52) U.S. Cl.
CPC ......... *H10K 59/121* (2023.02); *H10K 59/122* (2023.02); *H10K 59/353* (2023.02); *H10K 59/38* (2023.02)

(58) Field of Classification Search
CPC .. H10K 59/121; H10K 59/122; H10K 59/353; H10K 59/38; H10D 86/441
See application file for complete search history.

(56) References Cited

U.S. PATENT DOCUMENTS 9,575,228 B2 2/2017 Kim et al.
9,653,685 B2 5/2017 Watanabe
(Continued)

FOREIGN PATENT DOCUMENTS

KR 10-2236734 B1 4/2021

OTHER PUBLICATIONS

Nidhi M. Diwakar et al., "AC electrohydrodynamic propulsion and rotation of active particles of engineered shape and asymmetry", Current Opinion in Colloid & Interface Science, Jun. 2022, pp. 1-15, vol. 59, 101586, Elsevier.
(Continued)

*Primary Examiner* — Britt Hanley
*Assistant Examiner* — Casey Paul Boatman
(74) *Attorney, Agent, or Firm* — Womble Bond Dickinson (US) LLP

(57) ABSTRACT

A display device comprises pixels, each of the pixels comprising first to third sub-pixels. Each of the first to third sub-pixels comprises: first to fourth electrode spaced from each other; and an integrated light-emitting element electrically connected to the first to fourth electrodes. The integrated light-emitting element comprises: a first light-emitting element comprising a first end portion connected to the first electrode and a second end portion connected to the fourth electrode; a second light-emitting element comprising a first end portion connected to the second electrode and a second end portion connected to the fourth electrode; a third light-emitting element comprising a first end portion connected to the third electrode and a second end portion connected to the fourth electrode; and a shape memory polymer coupled to the second end portion of each of the first to third light-emitting elements.

20 Claims, 17 Drawing Sheets

(51) Int. Cl.
*H10K 59/35* (2023.01)
*H10K 59/38* (2023.01)

(56) References Cited

U.S. PATENT DOCUMENTS

2021/0135122 A1* 5/2021 Yan ........................ H10K 71/00
2022/0285427 A1* 9/2022 Son ...................... G09G 3/3266

OTHER PUBLICATIONS

"The Applications of Shape Memory Polymer", Electronic and Telecommunication Trend Analysis, vol. 143, Oct. 2013, pp. 24-33 with English translation of highlighted language on first page.

* cited by examiner

DISPLAY DEVICE

CROSS-REFERENCE TO RELATED APPLICATION

The present application claims priority to and the benefit of Korean patent application No. 10-2023-0001837 filed on Jan. 5, 2023, in the Korean Intellectual Property Office, the entire disclosure of which is incorporated by reference herein.

BACKGROUND

1. Field

The present disclosure generally relates to a display device.

2. Description of the Related Art

Recently, as interest in information displays is increased, research and development of display devices have been continuously conducted.

SUMMARY

Embodiments provide a display device having improved manufacturing efficiency.

One or more embodiments of the present disclosure provide a display device including: pixels including a first sub-pixel, a second sub-pixel, and a third sub-pixel adjacent to each other. The first to third sub-pixels include: a first electrode, a second electrode, a third electrode, and a fourth electrode spaced from each other; and an integrated light-emitting element electrically connected to the first to fourth electrodes. The integrated light-emitting element includes: a first light-emitting element including a first end portion electrically connected to the first electrode, and a second end portion electrically connected to the fourth electrode; a second light-emitting element including a first end portion electrically connected to the second electrode, and a second end portion electrically connected to the fourth electrode; a third light-emitting element including a first end portion electrically connected to the third electrode, and a second end portion electrically connected to the fourth electrode; and a shape memory polymer coupled to the second end portions of the first to third light-emitting elements.

The display device may further include: a first line extending in a first direction, the first line being electrically connected to the first electrode; a second line extending in the first direction, the second line being electrically connected to the second electrode; a third line extending in the first direction, the third line being electrically connected to the third electrode; and a fourth line extending in the first direction, the fourth line being electrically connected to the fourth electrode. The first line, the second line, the third line, and the fourth line may be spaced from each other.

The display device may further include: a first bridge pattern electrically connecting the first electrode and the first line to each other; a second bridge pattern electrically connecting the second electrode and the second line to each other; a third bridge pattern electrically connecting the third electrode and the third line to each other; and a fourth bridge pattern electrically connecting the fourth electrode and the fourth line to each other.

The fourth line may be configured to receive a low potential voltage.

The first electrode of the first sub-pixel, the first electrode of the second sub-pixel, and the first electrode of the third sub-pixel may be electrically connected to each other through the first line. The second electrode of the first sub-pixel, the second electrode of the second sub-pixel, and the second electrode of the third sub-pixel may be electrically connected to each other through the second line. The third electrode of the first sub-pixel, the third electrode of the second sub-pixel, and the third electrode of the third sub-pixel may be electrically connected to each other through the third line. The fourth electrode of the first sub-pixel, the fourth electrode of the second sub-pixel, and the fourth electrode of the third sub-pixel may be electrically connected to each other through the fourth line.

The first to third sub-pixels may include a pixel circuit having a transistor electrically connected to the integrated light-emitting element and a storage capacitor electrically connected to the transistor. The storage capacitor may be electrically connected to a corresponding bridge pattern from among the first to fourth bridge patterns.

The storage capacitor of the first sub-pixel may be electrically connected to the first line through the first bridge pattern. The storage capacitor of the second sub-pixel may be electrically connected to the second line through the second bridge pattern. The storage capacitor of the third sub-pixel may be electrically connected to the third line through the third bridge pattern.

The first to third sub-pixels may further include: a pixel circuit area, the pixel circuit being in the pixel circuit area, a first line area at an upper side of the pixel circuit area, a second line area at a lower side of the pixel circuit area; and a first alignment electrode, a second alignment electrode, a third alignment electrode, and a fourth alignment electrode spaced from each other and at a layer between the first to fourth bridge patterns and the first to fourth electrodes.

The first to fourth lines comprise a first set of first to fourth lines, the display device further comprising a second set of first to fourth lines. The first set of the first to fourth lines may be in the first line area, and the second set of the first to fourth lines are in the second line area. Arrangements of the first set of the first to fourth lines in the first line area and of the second set of the first to fourth lines in the second line area may be mirror-symmetrical to each other with the pixel circuit area therebetween.

The first to third sub-pixels may further include: an emission area, and a non-emission area around the emission area, the light from the integrated light-emitting element being emitted in the emission area; a first bank in the non-emission area, the first bank including an opening area corresponding to the emission area; a second bank above the first bank; a light-scattering layer above the integrated light-emitting element, and surrounded by the second bank; and a color filter above the light-scattering layer.

The first light-emitting element is configured to emit light of a first color. The second light-emitting element is configured to emit light of a second color that is different from the light of the first color. The third light-emitting element is configured to emit light of a third color that is different from the light of the first color and the light of the second color.

The light of the first color may be red light, the light of the second color may be green light, and the light of the third color may be blue light.

The first electrode and the fourth electrode may be at a same layer, and the second electrode and the third electrode may be at a same layer.

One light-emitting element from among the first to third light-emitting elements is longer than the other two light-emitting elements from among the first to third light-emitting elements.

The first to third sub-pixels may include a pixel circuit having a transistor electrically connected to the integrated light-emitting element and a storage capacitor electrically connected to the transistor. The display device may further include: a first bridge pattern electrically connecting the storage capacitor of the first sub-pixel and the first line to each other; a second bridge pattern electrically connecting the storage capacitor of the second sub-pixel and the second line to each other; a third bridge pattern electrically connecting the storage capacitor of the third sub-pixel and the third line to each other; and a fourth bridge pattern electrically connecting the fourth electrode of each of the first to third sub-pixels to the fourth line.

The first bridge pattern may electrically connect the first electrode of the first sub-pixel and the first line to each other. The second bridge pattern may electrically connect the second electrode of the second sub-pixel and the second line to each other. The third bridge pattern may electrically connect the third electrode of the third sub-pixel and the third line to each other.

The fourth line is configured to receive a low potential voltage.

One or more embodiments of the present disclosure provide a display device including: pixels including a first sub-pixel, a second sub-pixel, and a third sub-pixel arranged adjacent to each other above a substrate. The first to third sub-pixels include: a pixel circuit having a transistor, and a storage capacitor electrically connected to the transistor; an integrated light-emitting element electrically connected to the pixel circuit; a first electrode, a second electrode, a third electrode, and a fourth electrode electrically connected to the integrated light-emitting element, the first to fourth electrodes being spaced from each other; a first line extending in one direction and electrically connected to the storage capacitor of the first sub-pixel and the first electrode; a second line extending in the one direction and electrically connected to the storage capacitor of the second sub-pixel and the second electrode; a third line extending in the one direction and electrically connected to the storage capacitor of the third sub-pixel and the third electrode; and a fourth line extending in the one direction and electrically connected to the fourth electrode of each of the first to third sub-pixels.

The integrated light-emitting element may include a first light-emitting element configured to emit light of a first color, a second light-emitting element configured to emit light of a second color that is different from the light of the first color, a third light-emitting element configured to emit light of a third color that is different from the light of the second color, and a shape memory polymer coupled to one end portion of each of the first to third light-emitting elements.

The fourth line may be configured to receive a low potential voltage. The first light-emitting element may include a first end portion electrically connected the first electrode, and a second end portion electrically connected to the fourth electrode. The second light-emitting element may include a first end portion electrically connected to the second electrode, and a second end portion electrically connected to the fourth electrode. The third light-emitting element may include a first end portion electrically connected to the third electrode, and a second end portion electrically connected to the fourth electrode. The second end portion of each of the first to third light-emitting elements may be coupled to the shape memory polymer.

The second electrode and the third electrode in the first sub-pixel may be floated. The first electrode and the third electrode in the second sub-pixel may be floated. The first electrode and the second electrode in the third sub-pixel may be floated.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that the present disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
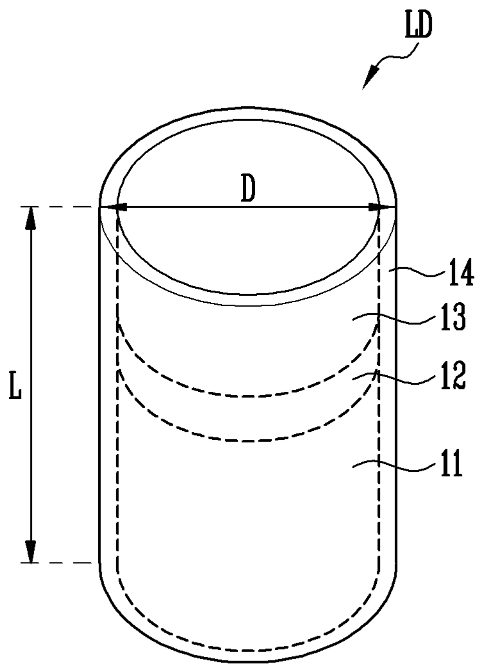
FIG. 1 is a schematic perspective view illustrating a light-emitting element in accordance with one or more embodiments.

The present disclosure may apply various changes and different shape, therefore only illustrate in detail with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, embodiments of the present disclosure and items suitable for those skilled in the art to easily understand the content of the present disclosure will be described in detail with reference to the accompanying drawings. In the following description, singular forms in the present disclosure are intended to include the plural forms as well, unless the context clearly indicates otherwise.

Figure 2:
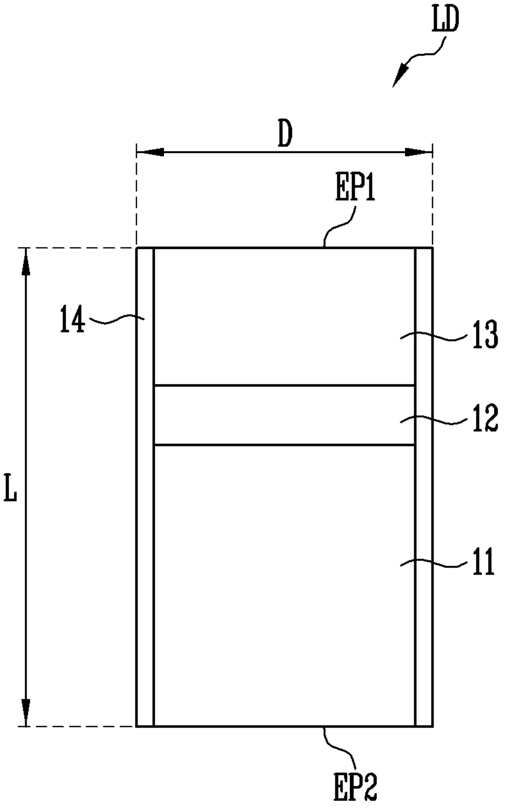
FIG. 2 is a schematic cross-sectional view of the light-emitting element shown in FIG. 1.

FIG. 1 is a schematic perspective view illustrating a light-emitting element LD in accordance with one or more embodiments. FIG. 2 is a schematic cross-sectional view of the light-emitting element LD shown in FIG. 1.

Referring to FIGS. 1 and 2, the light-emitting element LD may include a first semiconductor layer 11, a second semiconductor layer 13, and an active layer 12 interposed between the first and second semiconductor layers 11 and 13. For example, the light-emitting element LD may be implemented with a light-emitting stack structure (or stack pattern) in which the first semiconductor layer 11, the active layer 12, and the second semiconductor layer 13 are sequentially stacked.

The light-emitting element LD may be provided in a shape extending in one direction. In case that assuming that an extending direction of the light-emitting element LD is a length direction, the light-emitting element LD may include a first end portion EP1 and a second end portion EP2, which are opposite each other along the length direction. One semiconductor layer selected from among the first semiconductor layer 11 and the second semiconductor layer 13 may be located at the first end portion EP1 of the light-emitting element LD, and the other semiconductor layer selected from among the first semiconductor layer 11 and the second semiconductor layer 13 may be located at the second end portion EP2 of the light-emitting element LD. For example, the second semiconductor layer 13 may be located at the first end portion EP1 of the light-emitting element LD, and the first semiconductor layer 11 may be located at the second end portion EP2 of the light-emitting element LD. However, the present disclosure is not limited thereto.

The light-emitting element LD may be provided in various shapes. For example, the light-emitting element LD may have a rod-like shape, a bar-like shape, a pillar-like shape, or the like, which is long in its length direction (e.g., its aspect ratio is greater than 1) as shown in FIG. 1. In another example, the light-emitting element LD may have a rod-like shape, a bar-like shape, a pillar-like shape, or the like, which is short in its length direction (e.g., its aspect ratio is smaller than 1). In still another example, the light-emitting element LD may have a rod-like shape, a bar-like shape, a pillar-like shape, or the like, of which aspect ratio is 1.

The light-emitting element LD may include, for example, a light-emitting diode (LED) manufactured small enough to have a diameter D and/or a length L to a degree of a nano scale (or nanometers) to a micro scale (micrometers). In case that the light-emitting element LD is long in its length direction (e.g., its aspect ratio is greater than 1), the diameter D of the light-emitting element LD may be about 0.5 μm to about 6 μm, and the length L of the light-emitting element LD may be about 1 μm to about 10 μm. However, the diameter D and the length L of the light-emitting element LD are not limited thereto, and the size of the light-emitting element LD may be suitably changed (e.g., to accord with design conditions of a lighting device or a self-luminous display device, to which the light-emitting element LD is applied).

The first semiconductor layer 11 may include, for example, at least one n-type semiconductor layer. For example, the first semiconductor layer 11 may include one or more semiconductor materials selected from among InAlGaN, GaN, AlGaN, InGaN, AlN, and/or InN, and include an n-type semiconductor layer doped with a first conductive dopant (or n-type dopant) such as Si, Ge and/or Sn. However, the material constituting the first semiconductor layer 11 is not limited thereto. In addition, the first semiconductor layer 11 may be configured with various materials.

The active layer 12 is formed on the first semiconductor layer 11, and may be formed in a single or multiple quantum well structure. The active layer 12 may emit light having a wavelength of 400 nm to 900 nm, and use a double hetero structure. In one or more embodiments, a clad layer doped with a conductive dopant may be formed on the top and/or the bottom of the active layer 12 along the length L direction of the light-emitting element LD.

In case that an electric field having a suitable voltage (e.g., a predetermined voltage) or more is applied between both the end portions of the light-emitting element LD, the light-emitting element LD emits light as electron-hole pairs are combined in the active layer 12. The light emission of the light-emitting element LD is controlled by using such a principle, so that the light-emitting element LD can be used as a light source (or light-emitting source) for various light-emitting devices, including a pixel of a display device.

The second semiconductor layer 13 is formed on the active layer 12, and may include a semiconductor layer having a type different from that of the first semiconductor layer 11. For example, the second semiconductor layer 13 may include at least one p-type semiconductor material. For example, the second semiconductor layer 13 may include at least one semiconductor material selected from among InAlGaN, GaN, AlGaN, InGaN, AlN, and/or InN, and include a p-type semiconductor layer doped with a second conductive dopant (or p-type dopant) such as Mg, Zn, Ca, Sr and/or Ba. However, the material constituting the second semiconductor layer 13 is not limited thereto. In addition, the second semiconductor layer 13 may be configured with various materials.

The first semiconductor layer 11 and the second semiconductor layer 13 may have different thicknesses in the length direction of the light-emitting element LD. For example, the first semiconductor layer 11 may have a thickness relatively greater than that of the second semiconductor layer 13 along the length direction of the light-emitting element LD, but the present disclosure is not limited thereto.

In one or more embodiments, the light-emitting element LD may further include a contact electrode (hereinafter, referred to as a "first contact electrode") located on the top of the second semiconductor layer 13, in addition to the first semiconductor layer 11, the active layer 12, and the second semiconductor layer 13, which are described above. In other embodiments, the light-emitting element LD may further include another contact electrode (hereinafter, referred to as a "second contact electrode") located at one end of the first semiconductor layer 11. Each of the first and second contact electrodes may be an ohmic contact electrode, but the present disclosure is not limited thereto. In one or more embodiments, each of the first and second contact electrodes may be a Schottky contact electrode. The first and second contact electrodes may include a conductive material.

In one or more embodiments, the light-emitting element LD may further include an insulating film 14. However, in one or more embodiments, the insulating film 14 may be omitted, and may be provided to cover only portions of the first semiconductor layer 11, the active layer 12, and the second semiconductor layer 13.

The insulating film 14 can reduce or prevent the likelihood of an electrical short circuit that may occur in case that the active layer 12 is in contact with a conductive material in addition to the first semiconductor layer 11 and the second semiconductor layer 13. Also, the insulating film 14 may reduce or minimize a surface defect of the light-emitting element LD, thereby improving the lifetime and light emission efficiency of the light-emitting element LD. Also, in case that a plurality of light-emitting elements LD are densely located, the insulating film 14 can reduce or prevent the likelihood of an unwanted short circuit that may occur between the light-emitting elements LD. Whether the insulating film 14 is provided is not limited as long as the active layer 12 can reduce or prevent the likelihood of an occurrence of a short circuit with external conductive material.

The insulating film 14 may be provided in a shape partially or entirely surrounding the outer surface (e.g., the outer peripheral or circumferential surface) of the light-emitting stack structure including the first semiconductor layer 11, the active layer 12, and the second semiconductor layer 13.

The insulating film 14 may include a transparent insulating material. The insulating film 14 may include various materials having insulating properties. The insulating film 14 may be provided in the form of a single layer or may be provided in the form of a multi-layer including at least two layers.

In one or more embodiments, the light-emitting element LD may be implemented with a light-emitting pattern having a core-shell structure.

The above-described light-emitting element LD may be used as a light-emitting source (or light source) for various display devices. The light-emitting element LD may be manufactured through a surface treatment process.

An emission component including the above-described light-emitting element LD may be used for various types of electronic devices that suitably use a light source, including a display device.

Figure 3:
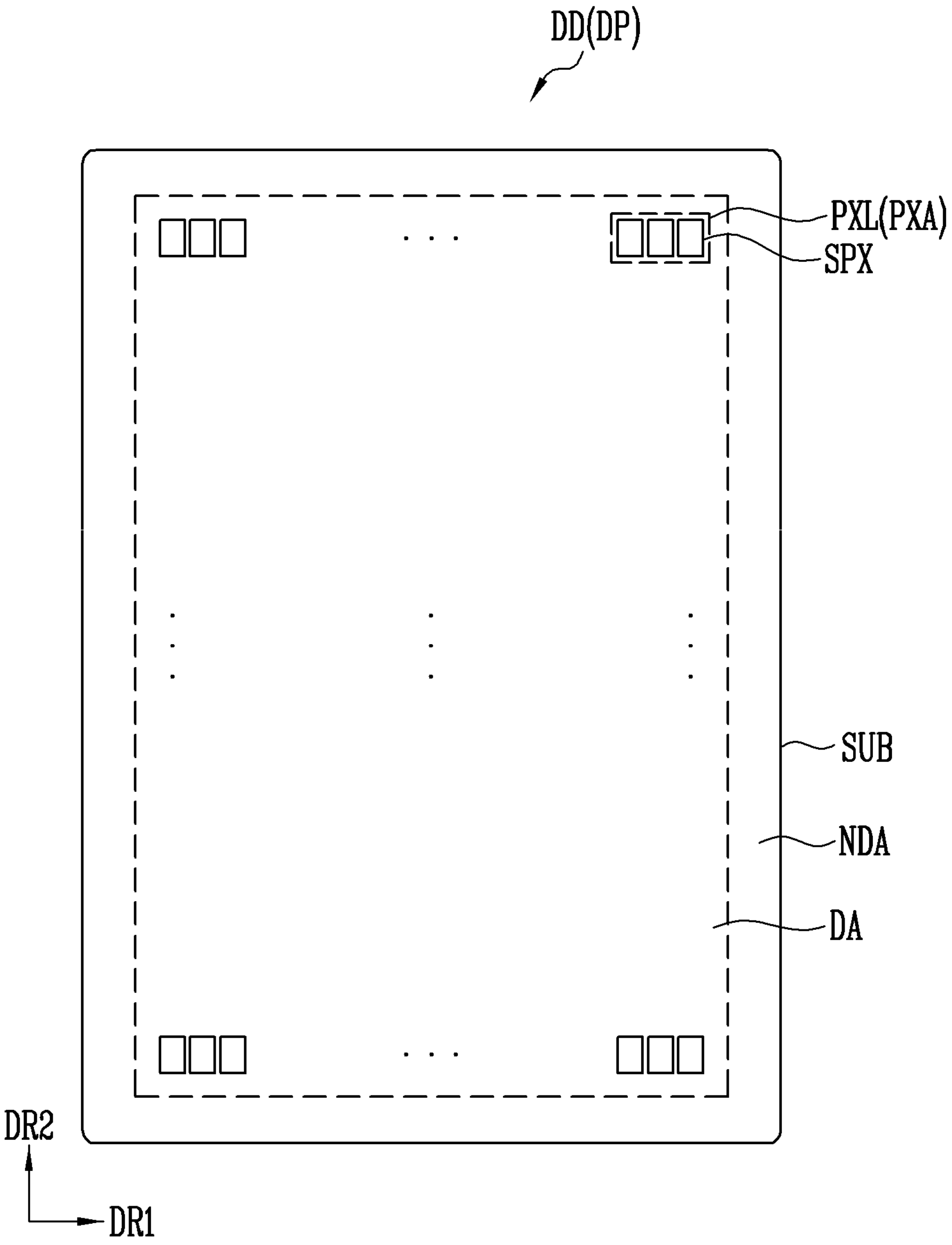
FIG. 3 is a schematic plan view illustrating a display device in accordance with one or more embodiments.

FIG. 3 is a schematic plan view illustrating a display device DD in accordance with one or more embodiments.

In FIG. 3, for convenience of description, a structure of the display device DD, for example, the display panel DP provided in the display device DD is briefly illustrated based on a display area DA in which an image is displayed.

Referring to FIGS. 1 to 3, the display device DD may be classified into a passive matrix type display device and an active matrix type display device according to a method of driving a light-emitting element LD. For example, in case that the display device DD is implemented as the active matrix type display device, each of pixels PXL may include a driving transistor for controlling an amount of current supplied to the light-emitting element LD, a switching transistor for transferring a data signal to the driving transistor, and the like.

The display panel DP (or the display device DD) may include a substrate SUB and the pixels PXL provided on the substrate SUB. Each of the pixels PXL may include a plurality of sub-pixels SPX. Each sub-pixel SPX may include a light-emitting element LD.

The substrate SUB may include a display area DA and a non-display area NDA along an edge or periphery of the display area DA.

The display area DA may be an area in which pixels PXL for displaying an image are provided. The non-display area NDA may be an area in which a driver for driving each pixel PXL (or sub-pixel SPX) and a portion of a line part connecting each pixel PXL and the driver to each other are provided.

The non-display area NDA may be located adjacent to the display area DA. The non-display area NDA may be provided at at least one side of the display area DA. For example, the non-display area NDA may be around (e.g., may surround) a periphery or circumference (e.g., edge) of the display area DA. A line part connected to each pixel PXL and a driver that is connected to the line part and drives the pixel PXL may be provided in the non-display area NDA.

The line part may electrically connect the driver and each pixel PXL to each other. The line part may include a fan-out line that provides a signal to each pixel PXL and is connected signal lines, e.g., a scan line, a data line, and the like, which are connected to each pixel PXL. In one or more embodiments, the line part may include a fan-out line connected to signal lines, e.g., a control line, a sensing line, and the like, which are connected to each pixel PXL, so as to compensate for an electrical characteristic change of each pixel PXL in real time. The line part may include a fan-out line that provides a suitable voltage (e.g., a predetermined voltage) to each pixel PXL and is connected to power lines connected to each pixel PXL.

The substrate SUB may include a transparent insulating material to enable light to be transmitted therethrough. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate and a plastic substrate, including a polymer organic material.

One area on the substrate SUB may be provided as the display area DA such that the pixels PXL are located therein, and the other area of the substrate SUB may be provided as a non-display area NDA. For example, the substrate SUB may include the display area DA including pixel areas PXA in which the respective pixels PXL are located and the non-display area NDA located at the edge or periphery of the display area DA (or adjacent to the display area DA).

Each of the pixels PXL may be provided in the display area DA of the substrate SUB. The pixels PXL may be arranged in a stripe arrangement structure or PENTILE® arrangement structure, or the like in the display area DA, but the present disclosure is not limited thereto. The PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each pixel PXL (or each sub-pixel SPX) may include at least one light-emitting element LD driven by a corresponding scan signal and a corresponding data signal. The light-emitting element LD may have a small size to a degree of nano scale (or nanometers) to micro scale (or micrometers), and may be connected in parallel to the light-emitting elements located adjacent to the light-emitting element LD, but the present disclosure is not limited thereto. The light-emitting element LD may constitute a light source of each pixel PXL.

Figure 4:
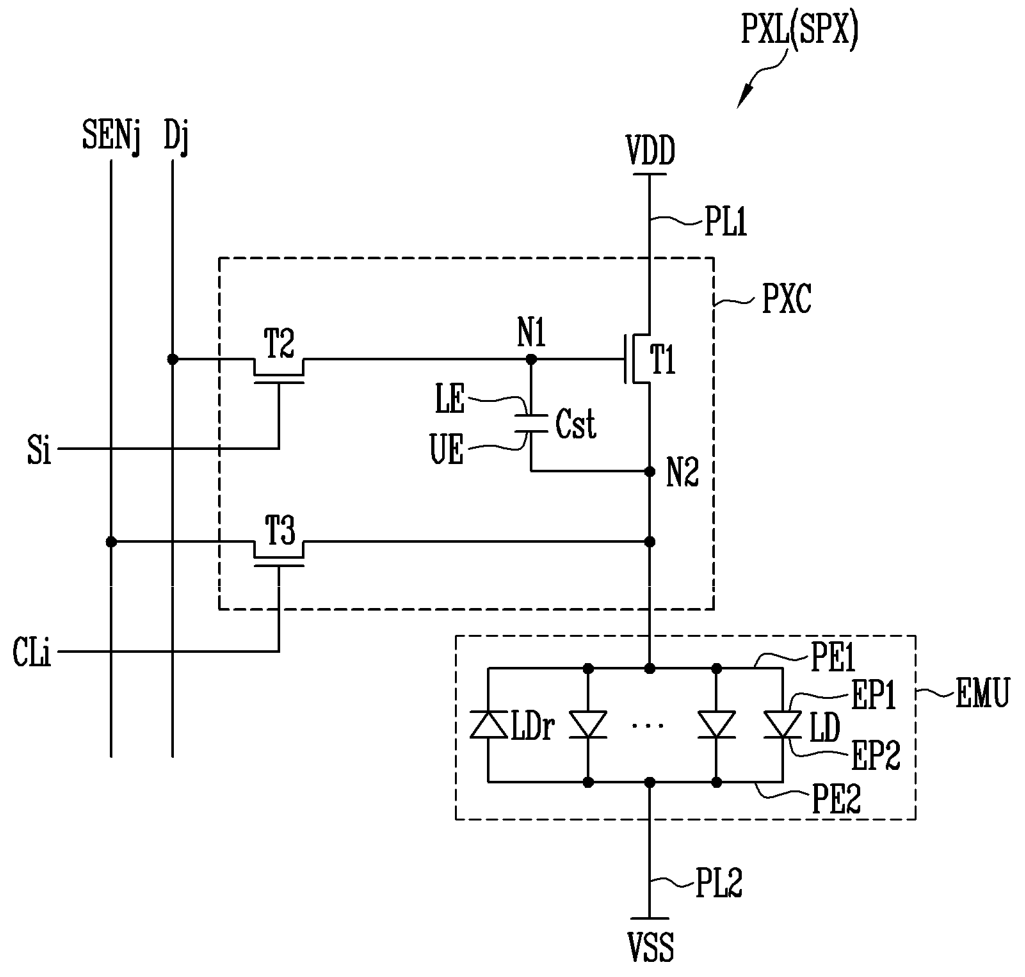
FIG. 4 is a schematic circuit diagram illustrating an electrical connection relationship of components included in each of the plurality of pixels shown in FIG. 3.

FIG. 4 is a schematic circuit diagram illustrating an electrical connection relationship of components included in each of the pixels PXL shown in FIG. 3.

For example, FIG. 4 illustrates an electrical connection relationship of components included in a pixel PXL (or sub-pixel SPX) applicable to an active matrix type display device in accordance with one or more embodiments. However, the connection relationship of the components of each pixel PXL (or sub-pixel SPX) is not limited thereto.

Referring to FIGS. 1 to 4, the sub-pixel SPX (or pixel PXL) may include an emission component EMU that generates light with a luminance corresponding to a data signal. Also, the sub-pixel SPX may selectively further include a pixel circuit PXC for driving the emission component EMU.

In one or more embodiments, the emission component EMU may include a plurality of light-emitting elements LD connected in parallel between a first power line PL1 connected to a first driving power source to be applied with a voltage of the first driving power source VDD and a second power line PL2 connected to a second driving power source VSS to be applied with a voltage of the second driving power source VSS. For example, the light-emitting element EMU may include a first pixel electrode PE1 connected to the first driving power source VDD via the pixel circuit PXC and the first power line PL1, a second pixel electrode PE2 connected to the second driving power source VSS through the second power line PL2, and a plurality of light-emitting elements LD connected in parallel in the same direction between the first and second pixel electrode PE1 and PE2. In one or more embodiments, the first pixel electrode PE1 may be an anode electrode and the second pixel electrode PE2 may be a cathode.

The first driving power source VDD may be set as a high-potential power source and the second driving power source VSS may be set as a low-potential power source. A potential difference between the first and second driving power sources VDD and VSS may be set equal to or higher than a threshold voltage of the light-emitting elements LD during a light emission period of the pixel PXL.

Each of the light-emitting element LD may include a first end portion EP1 (e.g., a p-type end portion) connected to the first driving power source VDD via at least one electrode (e.g., the first pixel electrode PE1), the pixel circuit PXC, and/or the first power line PL1, and a second end portion EP2 (e.g., an n-type end portion) connected to the second driving power source VSS via at least another electrode (e.g., the second pixel electrode PE2) and the second power line PL2. That is, the light-emitting elements LD may be connected in the forward direction between the first driving power source VDD and the second driving power source VSS. The light-emitting elements LD connected in the forward direction may constitute effective light sources of the emission component EMU.

The light-emitting elements LD of the emission component EMU may emit light with a luminance corresponding to a driving current supplied through the corresponding pixel circuit PXC. The driving current supplied to the emission component EMU may be divided to flow through each of the light-emitting elements LD. Accordingly, while each light-emitting element LD emits light with a luminance corresponding to a current flowing therethrough, the emission component EMU can emit light with the luminance corresponding to the driving current.

Although one or more embodiments in which both the end portions EP1 and EP2 of the light-emitting elements LD are connected in the same direction between the first and second driving power sources VDD and VSS has been described, but the present disclosure is not limited thereto. In one or more embodiments, the emission component EMU may further include at least one reverse light-emitting element LDr, in addition to the light-emitting elements LD forming the respective effective light sources. The reverse light-emitting element LDr is connected in parallel together with the light-emitting elements LD forming the effective light sources between the first and second pixel electrodes PE1 and PE2, and may be connected between the first and second pixel electrodes PE1 and PE2 in a direction opposite to that in which the light-emitting elements LD are connected. Although a suitable driving voltage (e.g., a predetermined driving voltage, e.g., a forward driving voltage) is applied between the first and second pixel electrodes PE1 and PE2, the reverse light-emitting element LDr maintains an inactivated state, and accordingly, no current substantially flows through the reverse light-emitting element LDr.

The pixel circuit PXC may be connected to a scan line Si and a data line Dj of the pixel PXL. Also, the pixel circuit PXC may be connected to a control line CLi and a sensing line SENj of the pixel PXL. For example, in case that the pixel PXL is located on an ith row and a jth column of the display area DA, the pixel circuit PXC of the pixel PXL may be connected an ith scan line Si, a jth data line Dj, an ith control line CLi, and a jth sensing line SENj of the display area DA.

The pixel circuit PXC may include first to third transistors T1 to T3 and a storage capacitor Cst.

The first transistor T1 is a driving transistor for controlling a driving current applied to the emission component EMU, and may be connected between the first driving power source VDD and the emission component EMU. Specifically, a first terminal of the first transistor T1 may be connected to the first driving power source VDD through the first power line PL1, a second terminal of the first transistor T1 may be connected to a second node N2, and a gate electrode of the first transistor T1 may be connected to a first node N1. The first transistor T1 may control an amount of driving current applied to the emission component EMU through the second node N2 from the first driving power source VDD according to a voltage applied to the first node N1. In one or more embodiments, the first terminal of the first transistor T1 may be a drain electrode, and the second terminal of the first transistor T1 may be a source electrode. However, the present disclosure is not limited thereto. In one or more embodiments, the first terminal may be the source electrode, and the second terminal may be the drain electrode.

The second transistor T2 is a switching transistor that selects a pixel PXL (or sub-pixel SPX) in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 are different terminals. For example, in case that the first terminal is a drain electrode, the second terminal may be a source electrode.

The second transistor T2 may be turned on in case that the scan signal having a gate-on voltage (e.g., a high level voltage) is supplied from the scan line Si, to electrically connect the data line Dj and the first node N1 to each other. The first node N1 is a point at the second terminal of the second transistor T2 and the gate electrode of the first transistor T1 are connected to each other, and the second transistor T2 may transfer a data signal to the gate electrode of the first transistor T1.

The third transistor T3 may connect the first transistor T1 to the sensing line SENj, to acquire a sensing signal through the sensing line SENj and to detect characteristics of the pixel PXL, including a threshold voltage of the first transistor T1, and the like, by using the sensing signal. Information on the characteristics of the pixel PXL may be used to convert image data such that a characteristic deviation between pixels PXL can be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. In addition, the first terminal of the third transistor T3 may be electrically connected to an initialization power source. The third transistor T3 is an initialization transistor capable of initializing the second node N2, and may be turned on in case that a sensing control signal is supplied from the control line CLi, to transfer a voltage of the initialization power source to the second node N2. Accordingly, an upper electrode UE of the storage capacitor Cst, which is electrically connected to the second node N2, can be initialized.

The storage capacitor Cst may include a lower electrode LE (or first storage electrode) and the upper electrode UE (or second storage electrode). The lower electrode LE may be electrically connected to the first node N1, and the upper electrode UE may be electrically connected to the second node N2. The storage capacitor Cst charges a data voltage corresponding to the data signal supplied to the first node N1 during one frame period. Accordingly, the storage capacitor Cst can store a voltage corresponding to a difference between a voltage of the gate electrode of the first transistor T1 and a voltage of the second node N2.

Although one or more embodiments in which the light-emitting elements LD constituting the emission component EMU are all electrically connected in parallel has been illustrated in FIG. 4, the present disclosure is not limited thereto. In one or more embodiments, the emission component EMU may be configured in a series/parallel hybrid structure in which a plurality of serial stages including a plurality of light-emitting elements LD electrically connected in parallel to each other are electrically connected to each other.

Also, although one or more embodiments in which the first to third transistors T1, T2, and T3 are all N-type transistors is disclosed in FIG. 4, the present disclosure is not limited thereto. For example, at least one of the first to third transistors T1, T2, or T3 may be replaced with a P-type transistor.

The structure of the pixel circuit PXC may be variously modified and embodied. For example, the pixel circuit PXC may additionally further include at least one transistor element such as a transistor element for initializing the first node N1 and/or a transistor element for controlling an emission time of the light-emitting elements LD, or other circuit elements such as a boosting capacitor for boosting a voltage of the first node N1.

Figure 5:
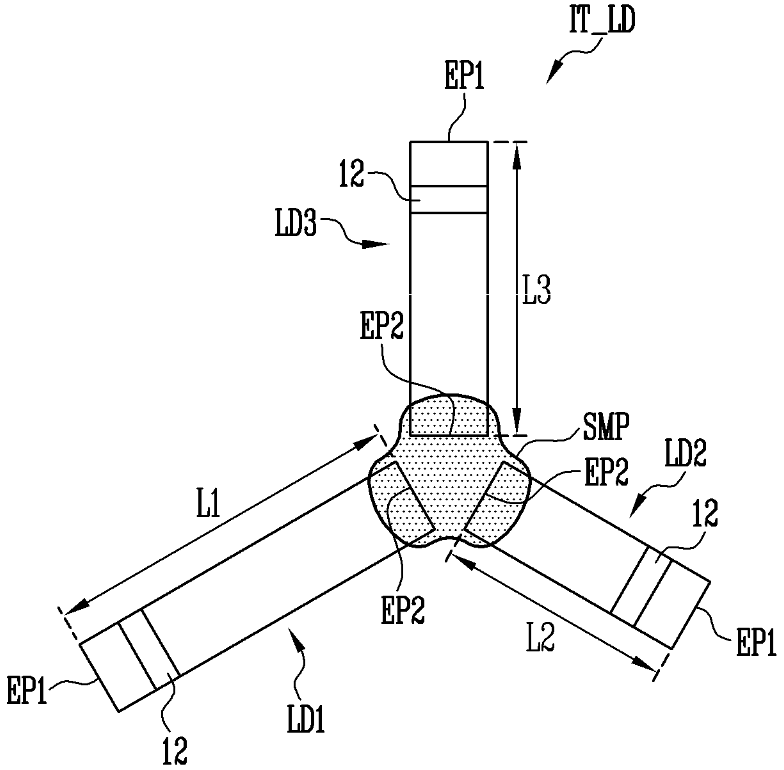
FIG. 5 is a schematic perspective view illustrating an integrated light-emitting element in accordance with one or more embodiments.

FIG. 5 is a schematic perspective view illustrating an integrated light-emitting element IT_LD in accordance with one or more embodiments.

Referring to FIGS. 1 to 5, the integrated light-emitting element IT_LD in accordance with one or more embodiments of the present disclosure may include a first light-emitting element LD1, a second light-emitting element LD2, and a third light-emitting element LD3, which are coupled to each other by a shape memory polymer SMP. For example, the integrated light-emitting element IT_LD may have a boomerang shape, but the present disclosure is not limited thereto.

In one or more embodiments, each of the first to third light-emitting elements LD1, LD2, and LD3 may be substantially identical or similar to the light-emitting element LD described with reference to FIGS. 1 and 2.

The first light-emitting element LD1 may emit light of a first color and include a first end portion EP1 and a second end portion EP2, which are opposite each other. The light of the first color may be red light, but the present disclosure is not limited thereto. The first light-emitting element LD1 may have a first length L1 in an extending direction (or length direction) thereof. The first light-emitting element LD1 may include an active layer 12 located between the first end portion EP1 and the second end portion EP2. In the first light-emitting element LD1, a buffer semiconductor layer may be located at each of the first end portion EP1 and the second end portion EP2. The buffer semiconductor layer may be formed with GaN undoped with an impurity or may be formed with GaN doped with a low concentration impurity. However, the present disclosure is not limited thereto.

The second light-emitting element LD2 may emit light of a second color and include a first end portion EP1 and a second end portion EP2, which are opposite each other. The light of the second color may be green light, which is different from the light of the first color, but the present disclosure is not limited thereto. The second light-emitting element LD2 may have a second length L2 in an extending direction (or length direction) thereof. The second length L2 may be different from the first length L1. For example, the second length L2 may be shorter than the first length L1, but the present disclosure is not limited thereto. The second light-emitting element LD2 may include an active layer 12 located between the first end portion EP1 and the second end portion EP2. In the second light-emitting element LD2, a p-type semiconductor layer may be located at the first end portion EP1, and an n-type semiconductor layer may be located at the second end portion EP2. In one or more embodiments, a low concentration n-type impurity may be doped onto the p-type semiconductor layer of the second light-emitting element LD2. For example, a doping layer in which a low concentration n-type impurity is doped onto the p-type semiconductor layer may be located at the first end portion EP1 of the second light-emitting element LD2.

The third light-emitting element LD3 may emit light of a third color and include a first end portion EP1 and a second end portion EP2, which are opposite each other. The light of the third color may be blue light, which is different from the light of the first color and the light of the second color, but the present disclosure is not limited thereto. The third light-emitting element LD3 may have a third length L3 in an extending direction (or length direction) thereof. The third length L3 may be shorter than the first length L1, but the present disclosure is not limited thereto. Also, the third length L3 may be equal to or different from the second length L2. The third light-emitting element LD3 may include an active layer 12 located between the first end portion EP1 and the second end portion EP2. In the third light-emitting element LD3, a p-type semiconductor layer may be located at the first end portion EP1, and an n-type semiconductor layer may be located at the second end portion EP2.

The shape memory polymer SMP may include a polymer that returns to a first state from temporarily modification applied in case that a specific temperature, a specific stimulus, or the like is provided. For example, the shape memory polymer SMP may include a polymer that "memorizes" an initial shape (e.g., "specific shape" or "first shape"), thereby returning to an original form from a shape (or "second shape") modified by an appropriate stimulus. The shape memory polymer SMP may go through a general processing process in which the shape memory polymer SMP has the initial shape, and then may be modified to be fixed to a temporary shape. This process may be referred to as a programming process, and the programming process may occur due to a modification, an increase or decrease in heat, or the like. However, the present disclosure is not limited thereto.

In one or more embodiments, the shape memory polymer SMP may be modified from the first shape (or initial shape) by an external stimulus to become the second shape. In case that the first to third light-emitting elements LD1, LD2, and LD3 of which surface treatment is completed are arranged in the shape memory polymer SMP having the second shape, and a heat treatment process is performed, the shape memory polymer SMP may be coupled to the second end portion EP2 of each of the first to third light-emitting elements LD1, LD2, and LD3 while returning to the first shape. The first light-emitting element LD1, the second light-emitting element LD2, and the third light-emitting element LD3, which are coupled to each other by using the shape memory polymer SMP, can be implemented into the integrated light-emitting element IT_LD.

Hereinafter, the integrated light-emitting element IT_LD in accordance with one or more embodiments of the present disclosure will be sequentially described according to a manufacturing method with reference to FIG. 6.

Figure 6:
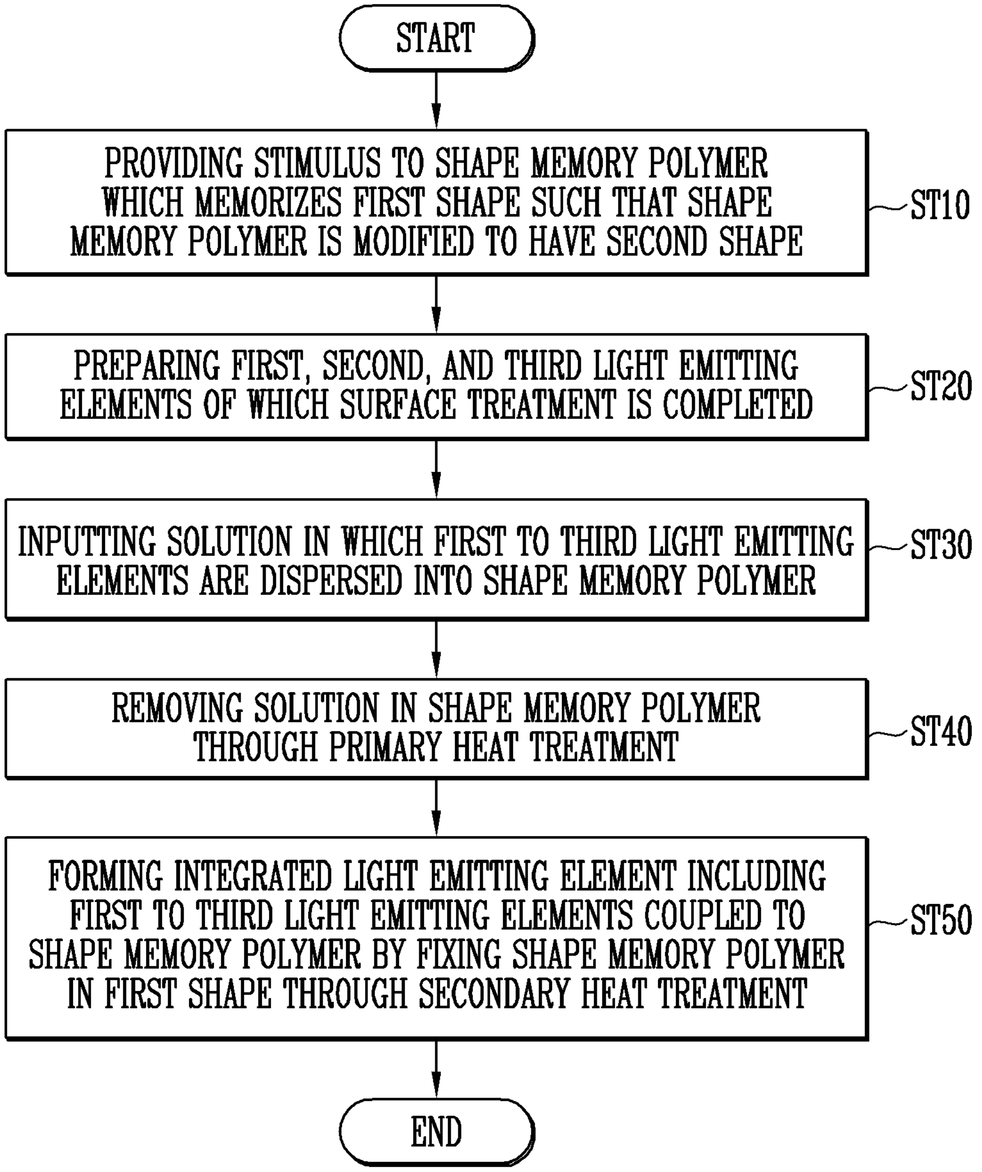
FIG. 6 is a schematic flowchart illustrating a manufacturing method of the integrated light-emitting element shown in FIG. 5.

FIG. 6 is a schematic flowchart illustrating a manufacturing method of the integrated light-emitting element shown in FIG. 5.

Referring to FIGS. 5 and 6, a stimulus is provided to a shape memory polymer SMP that memorizes a first shape (e.g., a predetermined shape or a specific shape) such that the shape memory polymer SMP is modified to have a second shape (ST10).

A first light-emitting element LD1, a second light-emitting element LD2, and a third light-emitting element LD3, of which surface treatment is completed, are prepared (ST20).

Each of the first light-emitting element LD1, the second light-emitting element LD2, and the third light-emitting element LD3 may be manufactured through a surface treatment process. For example, in case that a fluidic solution (or solvent) in which a plurality of light-emitting elements (see "LD" shown in FIG. 1) are mixed is supplied to a desired area (e.g., a pixel area PXA of each pixel PXL), each light-emitting element LD may be surface-treated such that the light-emitting elements LD are not unequally condensed in the solution but equally dispersed in the solution. For example, each of the light-emitting elements LD may be surface-treated such that an insulating film 14 itself is formed as a hydrophobic layer by using a hydrophobic material. In another example, each of the light-emitting elements LD may be surface-treated such that a hydrophobic film having a hydrophobic material is additionally formed on the insulating film 14. In one or more embodiments, each of the first light-emitting element LD1, the second light-emitting element LD2, and the third light-emitting element LD3 may be surface-treated using the above-described method.

A solution (or ink) in which the first light-emitting element LD1, the second light-emitting element LD2, and the third light-emitting element LD3 are dispersed is input into the shape memory polymer SMP through a fine inkjet process (ST30).

The first light-emitting element LD1, the second light-emitting element LD2, and the third light-emitting element LD3, of which surface treatment is completed, are not condensed in the shape memory polymer SMP but opposed to each other, thereby each having an arrangement (or alignment) space.

The solution corresponding to an additive is removed in the shape memory polymer SMP through a primary heat treatment process (ST40).

The method of removing the solution in the shape memory polymer SMP is not limited to the primary heat treatment process. In one or more embodiments, the solution may be removed in the shape memory polymer SMP by using UV treatment, plasma treatment, or the like.

An integrated light-emitting element IT_LD including the first to third light-emitting elements LD1, LD2, and LD3 coupled to the shape memory polymer SMP is formed by fixing the shape memory polymer SMP in the first shape which the shape memory polymer SMP memorizes through a secondary heat treatment process (ST50).

The method of fixing the shape memory polymer SMP is not limited to the secondary heat treatment process. In one or more embodiments, the shape memory polymer SMP may be fixed in the first shape by using UV treatment, plasma treatment, or the like.

In one or more embodiments, in case that the first shape which the shape memory polymer SMP memorizes is a boomerang shape, the shape memory polymer SMP may be coupled to a second end portion EP2 of each of the first to third light-emitting elements LD1, LD2, and LD3 in a process in which the shape memory polymer SMP returns to the first shape while the above-described secondary heat treatment process is performed. Therefore, one integrated light-emitting element IT_LD to which the first to third light-emitting elements LD1, LD2, and LD3 are coupled may be formed using the shape memory polymer SMP. The integrated light-emitting element IT_LD may have a boomerang shape corresponding to the first shape of the shape memory polymer SMP, but the present disclosure is not limited thereto.

Figure 7:
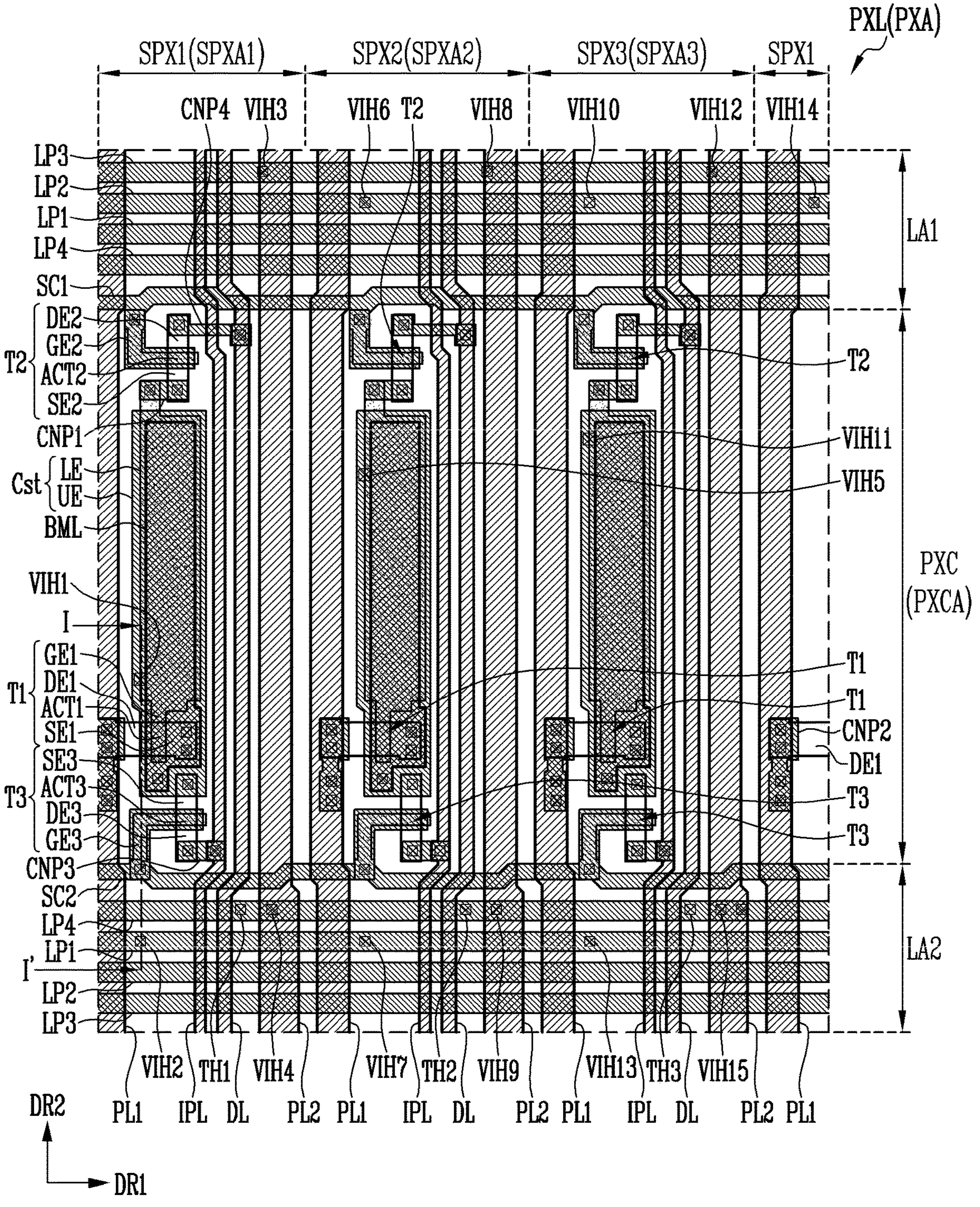
FIG. 7 is a schematic plan view illustrating a pixel area including a pixel circuit layer of a pixel in accordance with one or more embodiments.
Figure 8:
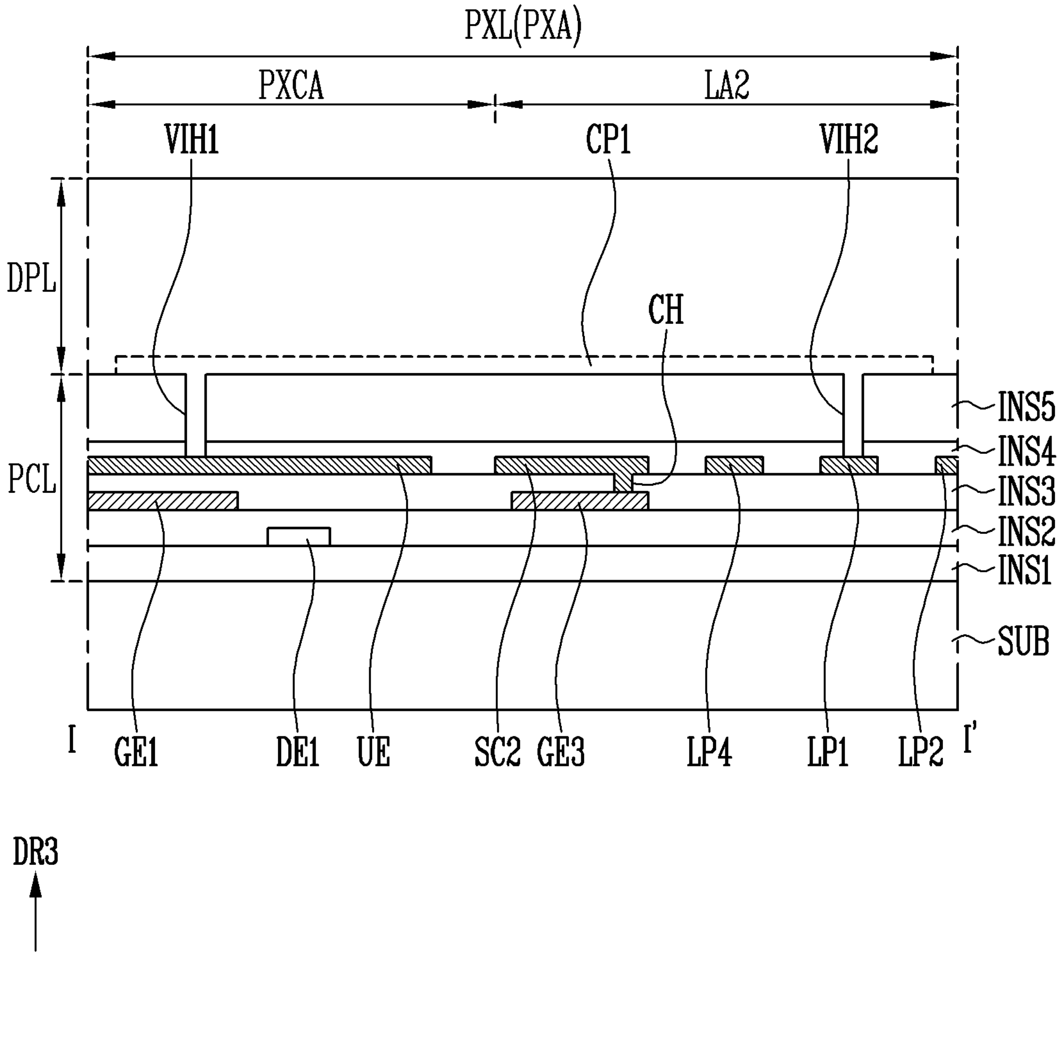
FIG. 8 is a schematic cross-sectional view taken along the line I-I' shown in FIG. 7.
Figure 9:
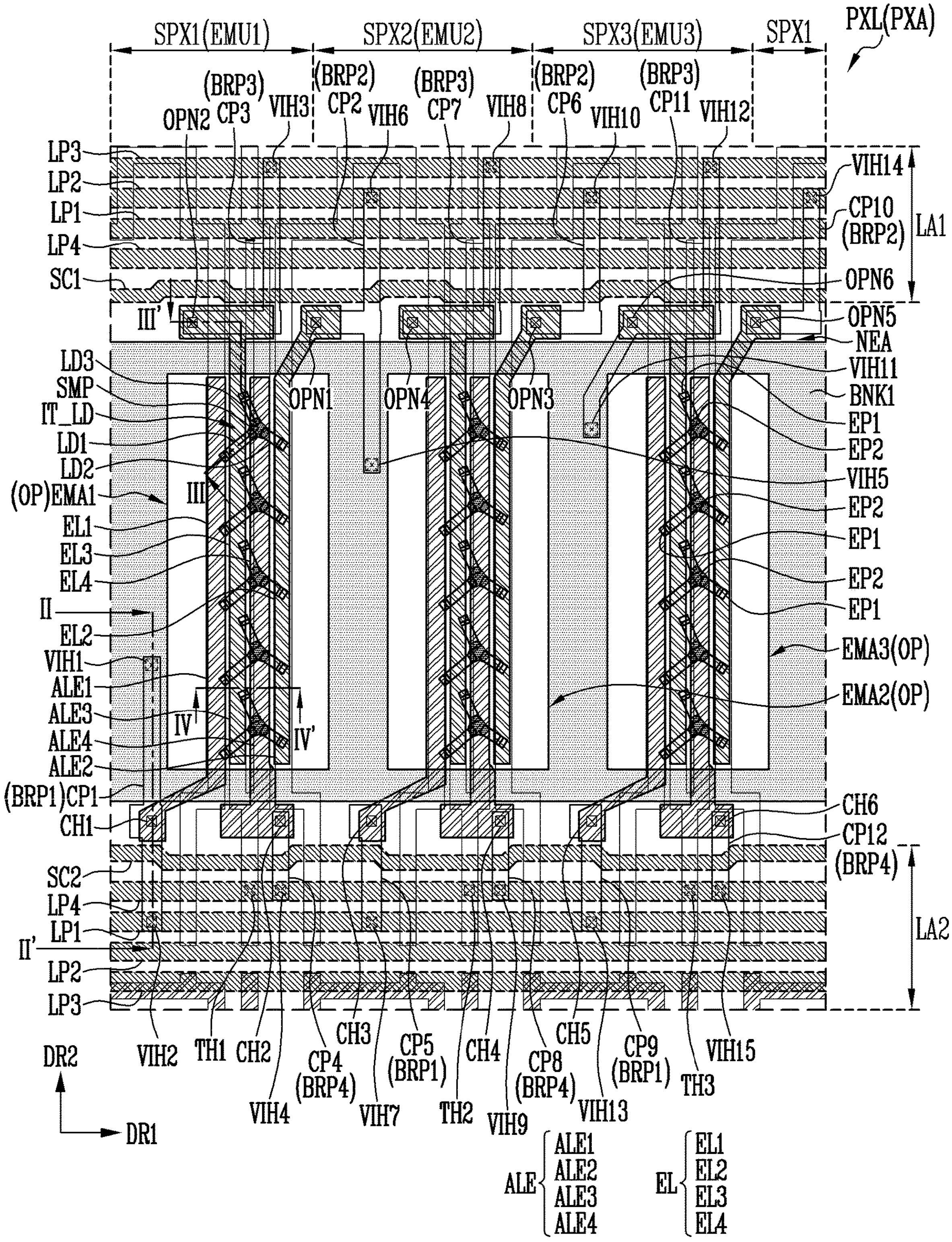
FIG. 9 is a schematic plan view illustrating a pixel area including a display element layer of a pixel in accordance with one or more embodiments.
Figure 10:
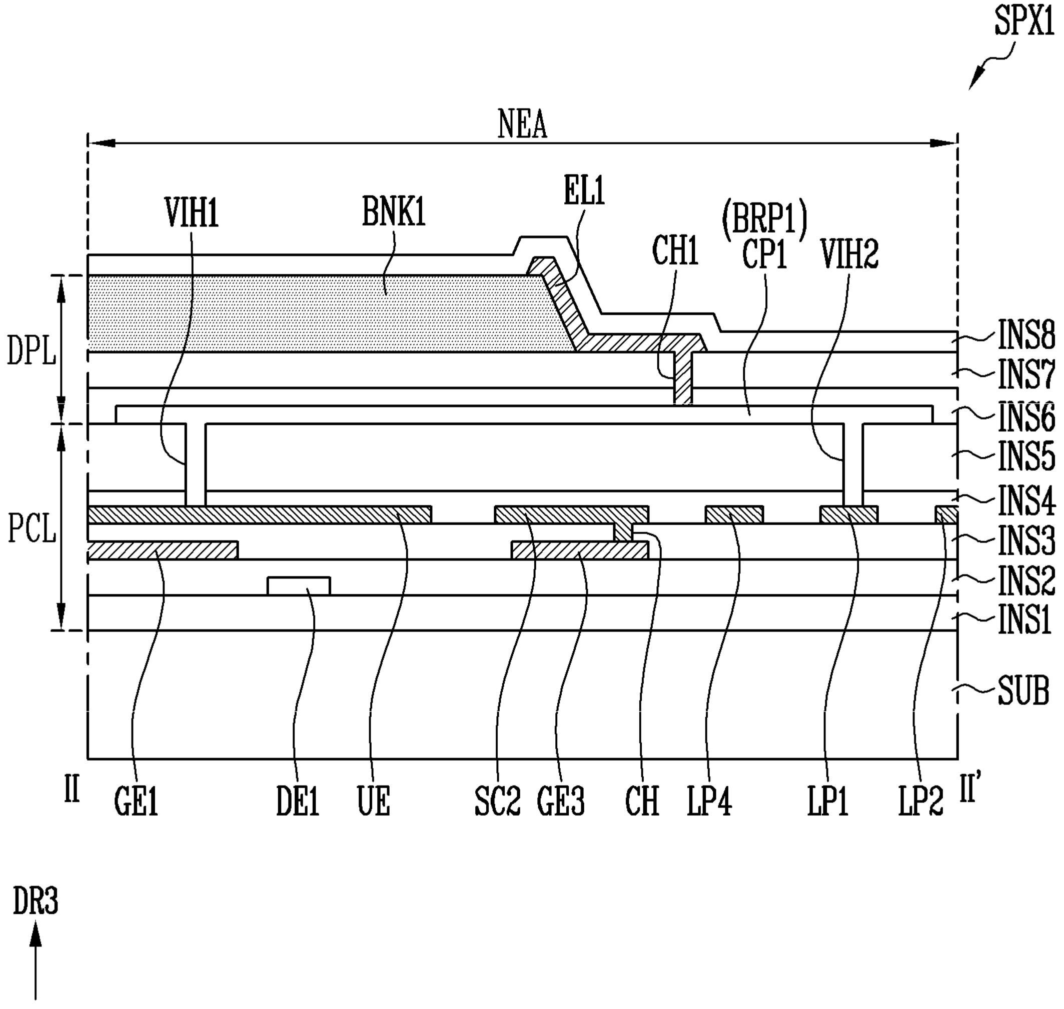
FIG. 10 is a schematic cross-sectional view taken along the line II-II' shown in FIG. 9.
Figure 11:
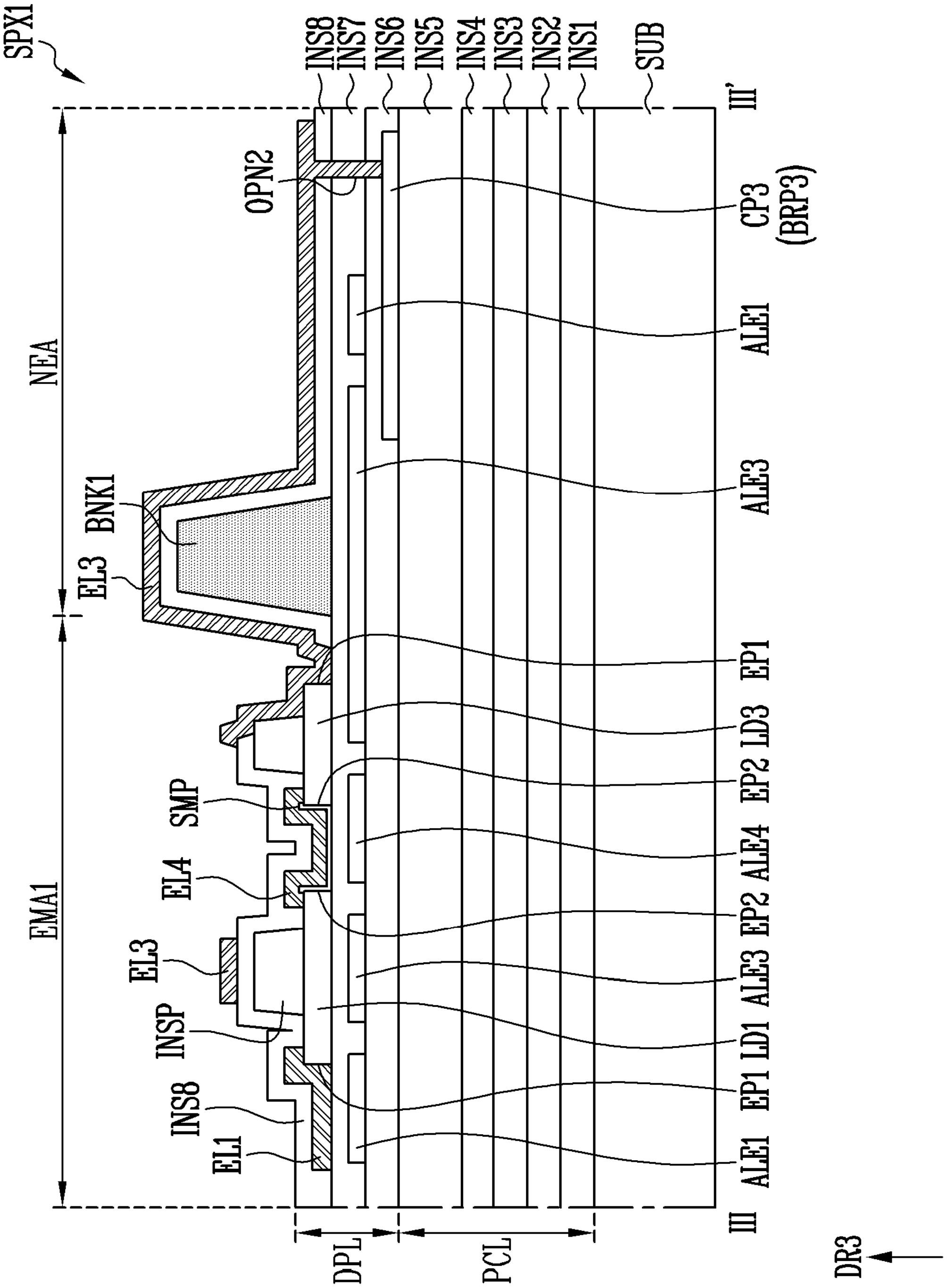
FIG. 11 is a schematic cross-sectional view taken along the line III-III' shown in FIG. 9.
Figure 12:
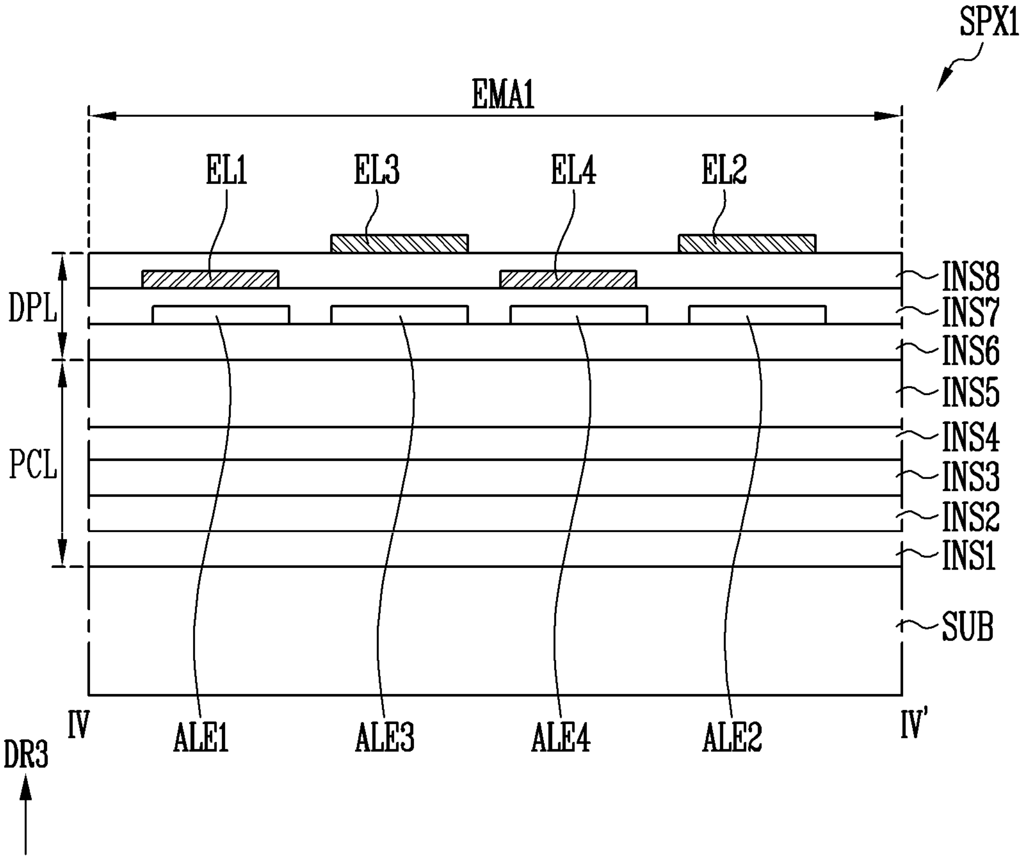
FIGS. 12 and 13 are schematic cross-sectional views taken along the line IV-IV' shown in FIG. 9.
Figure 13:
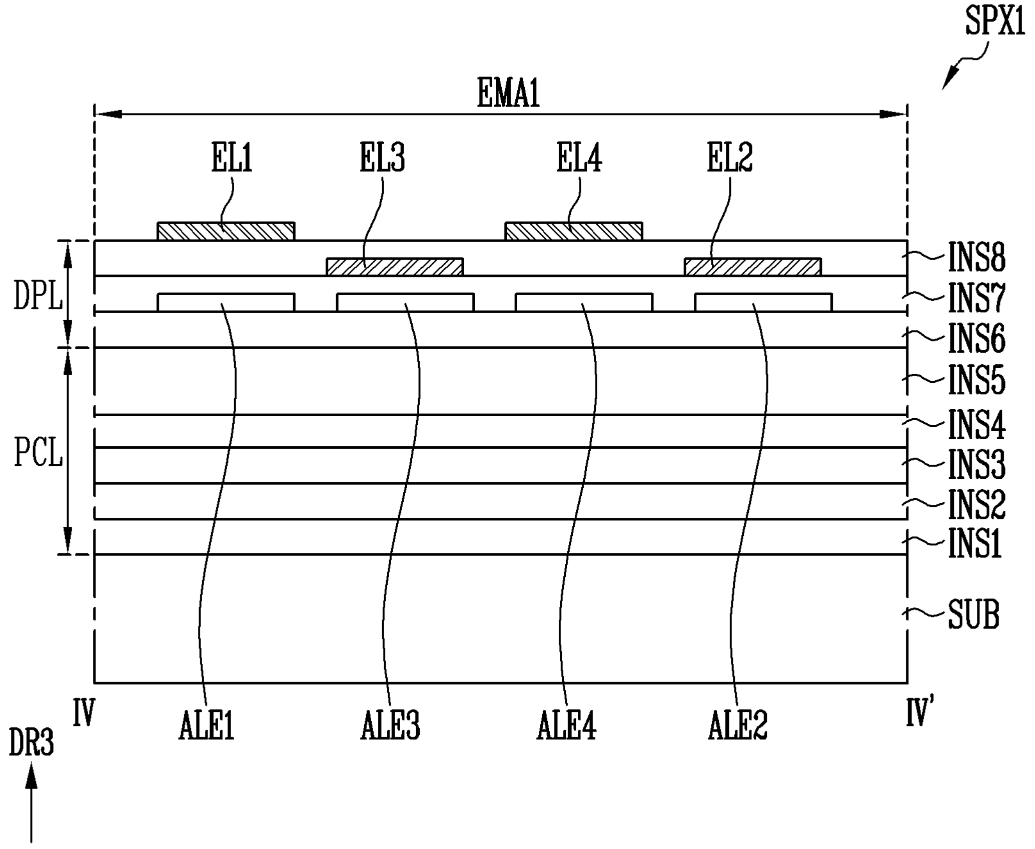

FIG. 7 is a schematic plan view illustrating a pixel area PXA including a pixel circuit layer of a pixel PXL in accordance with one or more embodiments. FIG. 8 is a schematic cross-sectional view taken along the line I-I' shown in FIG. 7. FIG. 9 is a schematic plan view illustrating a pixel area PXA including a display element layer of a pixel PXL in accordance with one or more embodiments. FIG. 10 is a schematic cross-sectional view taken along the line II-II' shown in FIG. 9. FIG. 11 is a schematic cross-sectional view taken along the line III-III' shown in FIG. 9. FIGS. 12 and 13 are schematic cross-sectional views taken along the line IV-IV' shown in FIG. 9.

In FIGS. 7 to 13, the pixel PXL may include not only components included in the pixel PXL but also an area in which the components are provided (or located).

In FIGS. 8 and 10 to 13, a pixel circuit layer PCL and a display element layer DPL of the pixel PXL is simplified and illustrated, such as that each electrode is illustrated as an electrode having a signal layer and each insulating layer is illustrated as an insulating layer provided as a single layer, but the present disclosure is not limited thereto.

The one or more embodiments corresponding to FIG. 13 illustrates a modified example of the one or more embodiments corresponding to FIG. 12 in relation to a forming relationship of first to fourth electrodes EL1, EL2, EL3, and EL4. For example, one or more embodiments in which the first and fourth electrodes EL1 and EL4 are formed after the second and third electrodes EL2 and EL3 are formed is illustrated in FIG. 13.

Referring to FIGS. 1 to 13, the pixel PXL may be located in a pixel area PXA as one area of the display area DA. The pixel PXL may include a first sub-pixel SPX1, a second sub-pixel SPX2, and a third sub-pixel SPX3.

The first sub-pixel SPX1 may include a first emission component EMU1 for generating light with a luminance corresponding to a data signal and a pixel circuit PXC for driving the first emission component EMU1. The second sub-pixel SPX2 may include a second emission component EMU2 for generating light with a luminance corresponding to a data signal and a pixel circuit PXC for driving the second emission component EMU2. The third sub-pixel SPX3 may include a third emission component EMU3 for generating light with a luminance corresponding to a data signal and a pixel circuit PXC for driving the third emission component EMU3.

The pixel PXL may include a substrate SUB, a pixel circuit layer PCL located on the substrate SUB, and a display element layer DPL located on the pixel circuit layer PCL.

The substrate SUB may include a transparent insulating material to enable light to be transmitted therethrough. The substrate SUB may be a rigid substrate or a flexible substrate.

The pixel circuit layer PCL may include at least one insulating layer located on the substrate SUB. For example, the pixel circuit layer PCL may include a first insulating layer INS1 (or buffer layer), a second insulating layer INS2 (or gate insulating layer), a third insulating layer INS3 (or interlayer insulating layer), a fourth insulating layer INS4 (or passivation layer), and a fifth insulating layer INS5 (or via layer), which are sequentially stacked on the substrate SUB along a third direction DR3.

The first insulating layer INS1 may be entirely located on the substrate SUB. The first insulating layer INS1 may reduce or prevent the likelihood of an impurity from being diffused into transistors T1, T2, and T3 included in the pixel circuit PXC of each of the first to third sub-pixels SPX1, SPX2, and SPX3. The first insulating layer INS1 may be an inorganic insulating layer including an inorganic material. The first insulating layer INS1 may include at least one selected from among silicon nitride ($SiN_x$), silicon oxide ($SiO_x$), and/or silicon oxynitride ($SiO_xN_y$), or include at least one metal oxide, such as, for example, aluminum oxide ($AlO_x$). The first insulating layer INS1 may be provided as a single layer, but be provided as a multi-layer including at least two layers. In case that the first insulating layer INS1 is provided as the multi-layer, the layers may be formed of the same material or may be formed of different materials. The first insulating layer INS1 may be omitted according to a material of the substrate SUB, a process condition, and the like.

The second insulating layer INS2 may be entirely located on the first insulating layer INS1. The second insulating layer INS2 may include the same material as the above-described first insulating layer INS1, or include an appropriate (or selected) material from among the materials disclosed as the material constituting the first insulating layer INS1. For example, the second insulating layer INS2 may be an inorganic insulting layer including an inorganic material.

The third insulating layer INS3 may be entirely provided and/or formed on the second insulating layer INS2. The third insulating layer INS3 may include the same material as the first insulating layer INS1, or include an appropriate (or selected) material from among the materials disclosed as the material constituting the first insulating layer INS1.

The fourth insulating layer INS4 may be entirely provided and/or formed on the third insulating layer INS3. The fourth insulating layer INS4 may include the same material as the first insulating layer INS1, or include an appropriate (or selected) material from among the materials disclosed as the material constituting the first insulating layer INS1.

The fifth insulating layer INS5 may be entirely provided and/or formed on the fourth insulating layer INS4. The fifth insulating layer INS5 may be an inorganic insulating layer including an inorganic material or an organic insulating layer including an organic material. The inorganic insulating layer may include, for example, at least one selected from among silicon nitride ($SiN_x$), silicon oxide ($SiO_x$), silicon oxynitride ($SiO_xN_y$), and/or aluminum oxide ($AlO_x$). The organic insulating layer may include, for example, at least one selected from among acrylic resin, epoxy resin, phenolic resin, polyamide resin, polyimide resin, unsaturated polyester resin, poly-phenylene ether resin, poly-phenylene sulfide resin, and/or benzocyclobutene resin. In one or more embodiments, the fifth insulating layer INS5 may be an organic insulating layer.

The pixel circuit layer PCL may include at least one conductive layer located between the above-described insulating layers. For example, the pixel circuit layer PCL may include a first conductive layer located between the substrate SUB and the first insulating layer INS1, a second conductive layer located on the second insulating layer INS2, and a third conductive layer located between the third insulating layer INS3 and the fourth insulating layer INS4.

The first conductive layer may be formed in a single layer including one or more selected from the group consisting of copper (Cu), molybdenum (Mo), tungsten (W), aluminum neodymium (AlNd), titanium (Ti), aluminum (Al), silver (Ag), and any alloy thereof or a mixture thereof, or may be formed in a double- or multi-layer structure including molybdenum (Mo), titanium (Ti), copper (Cu), aluminum (Al) and silver (Ag), which is a low-resistance material so as to decrease wiring resistance. Each of the second and third conductive layers may include the same material as the first conductive layer, or include at least one appropriate material (e.g., a suitable material) selected from among the materials disclosed as the material constituting the first conductive layer. However, the present disclosure is not limited thereto.

The display element layer DPL may include a sixth insulating layer INS6, a seventh insulating layer INS7, and an eighth insulating layer INS8, which are sequentially stacked on the pixel circuit layer PCL along the third direction DR3.

The sixth insulating layer INS6 may be entirely provided and/or formed on the pixel circuit layer PCL (or the fifth insulating layer INS5). The sixth insulating layer INS6 may be configured as a single layer or a multi-layer, and include one or more inorganic insulating materials selected from among silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The seventh insulating layer INS7 may be provided and/or formed on the sixth insulating layer INS6. The seventh insulating layer INS7 may include the same material as the sixth insulating layer INS6, or include an appropriate (or selected) material (e.g., a suitable material) selected from among the materials disclosed as the material constituting the sixth insulating layer INS6.

The eighth insulating layer INS8 may be provided and/or formed on the seventh insulating layer INS7. The eighth insulating layer INS8 may include the same material as the sixth insulating layer INS6, or include an appropriate (or selected) material (e.g., a suitable material) selected from among the materials disclosed as the material constituting the sixth insulating layer INS6.

The display element layer DPL may include at least one conductive layer located between the above-described insulating layers. For example, the display element layer DPL may include a fourth conductive layer located between the fifth insulating layer INS5 and the sixth insulating layer INS6, a fifth conductive layer located between the sixth insulating layer INS6 and the seventh insulating layer INS7, a sixth conductive layer located between the seventh insulating layer INS7 and the eighth insulating layer INS8, and a seventh conductive layer located on the eighth insulating layer INS8. Each of the fourth to seventh conductive layers may include the same material as the first conductive layer, or include at least one appropriate material (e.g., a suitable material) selected from among the materials disclosed as the material constituting the first conductive layer. However, the present disclosure is not limited thereto.

The pixel area PXA may include a first sub-pixel area SPXA1, a second sub-pixel area SPXA2, and a third sub-pixel area SPXA3, which are adjacent to each other in the first direction DR1. The first sub-pixel area SPXA1 may be one area of the pixel area PXA, in which the first sub-pixel SPX1 is located, the second sub-pixel area SPXA2 may be one area of the pixel area PXA, in which the second sub-pixel SPX2 is located, and the third sub-pixel area SPXA3 may be one area of the pixel area PXA, in which the third sub-pixel SPX3 is located.

Signal lines, e.g., a data line DL, first and second power lines PL1 and PL2, and an initialization power line IPL, which extend in a second direction DR2, may be located in each of the first to third sub-pixel areas SPXA1, SPXA2, and SPXA3.

The data line DL may be electrically connected to a pixel circuit PXC of each of the first, second, and third sub-pixels SPX1, SPX2, and SPX3, and extend in the second direction DR2 crossing the first direction DR1. The data line DL may be the data line Dj described with reference to FIG. 4, and may be supplied with a data signal. In one or more embodiments, the data line DL may be configured with the first conductive layer. The data line DL may be electrically connected to a second transistor T2 of the pixel circuit PXC through a corresponding contact hole.

The first power line PL1 may be electrically connected to a pixel circuit PXC of each of the first, second, and third sub-pixels SPX1, SPX2, and SPX3, and extend in the second direction DR2. The first power line PL1 may be the first power line PL1 described with reference to FIG. 4, and may be supplied with the voltage of the first driving power source VDD. In one or more embodiments, the first power line PL1 may be configured with the first conductive layer. The first power line PL1 may be electrically connected to a first transistor of the pixel circuit PXC through a corresponding contact hole.

The second power line PL2 may be electrically connected to a pixel circuit PXC of each of the first, second, and third sub-pixels SPX1, SPX2, and SPX3, and extend in the second direction DR2. The second power line PL2 may be the second power line PL2 described with reference to FIG. 4, and may be supplied with the voltage of the second driving power source VSS. The second power line PL2 may be configured with the first conductive layer. The second power line PL2 may be electrically connected to a fourth line LP4 located in a second line area LA2 through a corresponding contact hole. In one or more embodiments, the second power line PL2 may be electrically connected to a fourth line LP4 located in a first line area LA1.

The initialization power line IPL may be electrically connected to a pixel circuit PXC of each of the first, second, and third sub-pixels SPX1, SPX2, and SPX3, and extend in the second direction DR2. The initialization power line IPL may be the sensing line SENj described with reference to FIG. 4. The initialization power line IPL may be supplied with the voltage of the initialization power source. The initialization power line IPL may be configured with the first conductive layer. The initialization power line IPL may be electrically connected to a third transistor T3 of the pixel circuit PXC through a corresponding contact hole.

In one or more embodiments, each of the first to third sub-pixel areas SPXA1, SPXA2, and SPXA3 may include a first line area LA1, a pixel circuit area PXCA, and a second line area LA2, which are adjacent to each other in the second direction DR2. The pixel circuit area PXCA may be an area in which a pixel circuit PXC of each of the first to third sub-pixels SPX1, SPX2, and SPX3 is located, and each of the first and second line areas LA1 and LA2 may be an area in which signal lines extending in the first direction DR1 are located. The first line area LA1 may be located at an upper side of the pixel circuit area PXCA, and the second line area LA2 may be located at a lower side of the pixel circuit area PXCA.

A first line LP1, a second line LP2, a third line LP3, and a fourth line LP4, which extend in the first direction DR1 (or horizontal direction), may be located in each of the first and second line areas LA1 and LA2. In addition, a first scan line SC1 may be located in the first line area LA1, and a second scan line SC2 may be located in the second area LA2. The first scan line SC1, the second scan line SC2, and the first to fourth lines LP1, LP2, LP3, and LP4, which are described above, may be configured with the third conductive layer.

The first scan line SC1 may be located in the first line area LA1, and extend in the first direction DR1. The first scan line SC1 may be supplied with a scan signal. The first scan line SC1 may be electrically connected to a second gate electrode GE2 of a second transistor T2 of each of the first to third sub-pixels SPX1, SPX2, and SPX3 through a corresponding contact hole.

The second scan line SC2 may be located in the second line area LA2, and extend in the first direction DR1. The second scan line SC2 may be supplied with a sensing control signal. The second scan line SC2 may be electrically connected to a third gate electrode GE3 of a third transistor T3 of each of the first to third sub-pixels SPX1, SPX2, and SPX3 through a corresponding contact hole CH as shown in FIG. 8. The contact hole CH may be formed as one area of the third insulating layer INS3 located between the second scan line SC2 and the third gate electrode GE3 is removed.

The first scan line SC1, the fourth line LP4, the first line LP1, the second line LP2, and the third line LP3 may be sequentially arranged along the second direction DR2 in the first line area LA1. The second scan line SC2, the fourth line LP4, the first line LP1, the second line LP2, and the third line LP3 may be sequentially arranged along the opposite direction of the second direction DR2 in the second line area LA2. The arrangement of the first to fourth lines LP1, LP2, LP3, and LP4 of the first line area LA1 and the arrangement of the first to fourth lines LP1, LP2, LP3, and LP4 of the second line area LA2 may be mirror-symmetrical to each other with the pixel circuit area PXCA interposed therebetween, but the present disclosure is not limited thereto.

The first to fourth lines LP1 to LP4 located in the first and second line areas LA1 and LA2 may be common lines commonly provided to the first to third sub-pixels SPX1, SPX2, and SPX3.

In the second line area LA2, the first line LP1 may be electrically connected to a first conductive pattern CP1 of the display element layer DPL of the first sub-pixel SPX1 through a second via hole VIH2 (e.g., see FIG. 8). The second via hole VIH2 may be formed as one areas of the fourth and fifth insulating layers INS4 and INS5, which are located between the first line LP1 and the first conductive pattern CP1, are removed.

In the second line area LA2, the fourth line LP4 may be electrically connected to third and fourth alignment electrodes ALE3 and ALE4 of the display element layer DPL of the first sub-pixel SPX1 through a first through hole TH1 (e.g., see FIG. 9). The first through hole TH1 may be formed as one areas of the fourth to sixth insulating layers INS4, INS5, and INS6, which are located between the fourth line LP4 and the third and fourth alignment electrodes ALE3 and ALE4, are removed. Also, the fourth line LP4 may be electrically connected to a fourth conductive pattern CP4 of the display element layer DPL through a fourth via hole VIH4. The fourth via hole VIH4 may be formed as one areas of the fourth and fifth insulating layers INS4 and INS5, which are located between the fourth line LP4 and the fourth conductive pattern CP4, are removed.

In the second line area LA2, the first line LP1 may be electrically connected to a fifth conductive pattern CP5 of the display element layer DPL of the second sub-pixel SPX2 through a seventh via hole VIH7. The seventh via hole VIH7 may be formed as one areas of the fourth and fifth insulating layers INS4 and INS5, which are located between the first line LP1 and the fifth conductive pattern CP5, are removed.

In the second line area LA2, the fourth line LP4 may be electrically connected to third and fourth alignment electrodes ALE3 and ALE4 of the display element layer DPL of the second sub-pixel SPX2 through a second through hole TH2. The second through hole TH2 may be formed as one areas of the fourth to sixth insulating layers INS4, INS5, and INS6, which are located between the fourth line LP4 and the third and fourth alignment electrodes ALE3 and ALE4, are removed. Also, the fourth line LP4 may be electrically connected to an eighth conductive pattern CP8 of the display element layer DPL through a ninth via hole VIH9. The ninth via hole VIH9 may be formed as one areas of the fourth and fifth insulating layers INS4 and INS5, which are located between the fourth line LP4 and the eighth conductive pattern CP8, are removed.

In the second line area LA2, the first line LP1 may be electrically connected to a ninth conductive pattern CP9 of the display element layer DPL of the third sub-pixel SPX3 through a thirteenth via hole VIH13. The thirteenth via hole VIH13 may be formed as one areas of the fourth and fifth insulating layers INS4 and INS5, which are located between the first line LP1 and the ninth conductive pattern CP9, are removed.

In the second line area LA2, the fourth line LP4 may be electrically connected to third and fourth alignment electrodes ALE3 and ALE4 of the display element layer DPL of the third sub-pixel SPX3 through a third through hole TH3. The third through hole TH3 may be formed as one areas of the fourth to sixth insulating layers INS4, INS5, and INS6, which are located between the fourth line LP4 and the third and fourth alignment electrodes ALE3 and ALE4, are removed. Also, the fourth line LP4 may be electrically connected to a twelfth conductive pattern CP12 of the display element layer DPL through a fifteenth via hole VIH15. The fifteenth via hole VIH15 may be formed as one areas of the fourth and fifth insulating layers INS4 and INS5, which are located between the fourth line LP4 and the twelfth conductive pattern 12, are removed.

In the first line area LA1, the third line LP3 may be electrically connected to a third conductive pattern CP3 of the display element layer DPL of the first sub-pixel SPX1 through a third via hole VIH3. The third via hole VIH3 may be formed as one areas of the fourth and fifth insulating layers INS4 and INS5, which are located between the third line LP3 and the third conductive pattern CP3, are removed.

In the first line area LA1, the second line LP2 may be electrically connected to a second conductive pattern CP2 of the display element layer DPL of the second sub-pixel SPX2 through a sixth via hole VIH6. The sixth via hole VIH6 may be formed as one areas of the fourth and fifth insulating layers INS4 and INS5, which are located between the second line LP2 and the second conductive pattern CP2, are removed. Also, in the first line area LA1, the third line LP3 may be electrically connected to a seventh conductive pattern CP7 of the display element layer DPL through an eighth via hole VIH8. The eighth via hole VIH8 may be formed as one areas of the fourth and fifth insulating layers INS4 and INS5, which are located between the third line LP3 and the seventh conductive pattern CP7, are removed.

In the first line area LA1, the second line LP2 may be electrically connected to a tenth conductive pattern CP10 of the display element layer DPL of the third sub-pixel SPX3 through a fourteenth via hole VIH14. The fourteenth via hole VIH14 may be formed as one areas of the fourth and fifth insulating layers INS4 and INS5, which are located between the second line LP2 and the tenth conductive pattern CP10, are removed. Also, in the first line area LA1, the third line LP3 may be electrically connected to an eleventh conductive pattern CP11 of the display element layer DPL through a twelfth via hole VIH12. The twelfth via hole VIH12 may be formed as one areas of the fourth and fifth insulating layers INS4 and INS5, which are located between the third line LP3 and the eleventh conductive pattern CP11, are removed. Also, the second line LP2 may be electrically connected to a sixth conductive pattern CP6 of the display element layer DPL through a tenth via hole VIH10. The tenth via hole VIH10 may be formed as one areas of the fourth and fifth insulating layers INS4 and INS5, which are located between the second line LP2 and the sixth conductive pattern CP6, are removed.

In the second line area LA2, the fourth line LP4 may be electrically connected to the second power line PL2 to be supplied with the voltage of the second driving power source VSS.

A pixel circuit PXC of each of the first to third sub-pixels SPX1, SPX2, and SPX3 may include a first transistor T1, a second transistor T2, a third transistor T3, and a storage capacitor Cst. The pixel circuit PXC may be located in the pixel circuit area PXCA.

The pixel circuit PXC of the first sub-pixel SPX1, the pixel circuit PXC of the second sub-pixel SPX2, and the pixel circuit PXC of the third sub-pixel SPX3 may have structures substantially similar or identical to one another. Hereinafter, the pixel circuit PXC of the first sub-pixel SPX1 will be mainly described, and descriptions of the pixel circuit PXC of the second sub-pixel SPX2 and the pixel circuit PXC of the third sub-pixel SPX3 will be simplified.

The pixel circuit PXC of the first sub-pixel SPX1 may include first to third transistors T1, T2, and T3 and a storage capacitor Cst (hereinafter, referred to as a "first storage capacitor").

The first transistor T1 may include a first gate electrode GE1, a first active pattern ACT1, a first source electrode SE1, and a first drain electrode DE1.

The first gate electrode GE1 may be electrically connected to a second source electrode SE2 of the second transistor T2 through a first connection pattern CNP1. The first gate electrode GE1 may be configured with the second conductive layer.

The first connection pattern CNP1 may be configured with the third conductive layer. One end of the first connection pattern CNP1 may be electrically connected to the first gate electrode GE1 through a corresponding contact hole. The other end of the first connection pattern CNP1 may be electrically connected to the second source electrode SE2.

The first active pattern ACT1, the first source electrode SE1, and the first drain electrode DE1 may be configured with a semiconductor pattern made of poly-silicon, amorphous silicon, an oxide semiconductor, or the like. The first active pattern ACT1, the first source electrode SE1, and the first drain electrode DE1 may be formed with a semiconductor layer undoped or doped with an impurity. For example, the first source electrode SE1 and the first drain electrode DE1 may be configured with a semiconductor layer doped with the impurity, and the first active pattern ACT1 may be configured with an intrinsic semiconductor layer undoped with the impurity.

The first active pattern ACT1 may be located on the bottom of the first gate electrode GE1, thereby overlapping with the first gate electrode GE1 (e.g., in a thickness direction of the substrate SUB, or in a third direction DR3). The first active pattern ACT1 may constitute a channel region of the first transistor T1.

The first source electrode SE1 may be connected to one end of the first active pattern ACT1. The first source electrode SE1 may be electrically connected to a bottom metal pattern BML through a corresponding contact hole. Also, the first source electrode SE1 may be electrically connected to an upper electrode UE of the first storage capacitor Cst through another corresponding contact hole.

The bottom metal pattern BML may be configured with the first conductive layer, and overlap with the first transistor T1 (e.g., in a thickness direction of the substrate SUB, or in the third direction DR3). The bottom metal pattern BML may be electrically connected to the first source electrode SE1 through a corresponding contact hole. Also, the bottom metal pattern BML may be electrically connected to the upper electrode UE of the first storage capacitor Cst through another corresponding contact hole. Thus, the bottom metal pattern BML can widen the driving range of a voltage supplied to the first gate electrode GE1. In addition, as the bottom metal pattern BML is electrically connected to the first source electrode SE1 and the upper electrode UE, the likelihood of floating of the bottom metal pattern BML can be reduced or prevented.

The first drain electrode DE1 may be connected to the other end of the first active pattern ACT1. The first drain electrode DE1 may be electrically connected to a second connection pattern CNP2 through a corresponding contact hole.

The second connection pattern CNP2 may be configured with the third conductive layer, and overlap with the first drain electrode DE1 and the first power line PL1. One area of the second connection pattern CNP2 may be electrically connected to the first drain electrode DE1 through a corresponding contact hole. Another area of the second connection pattern CNP2 may be electrically connected to the first power line PL1 through a corresponding contact hole. The first drain electrode DE1 and the first power line PL1 may be electrically connected to each other through the second connection pattern CNP2.

The second transistor T2 may include a second gate electrode GE2, a second active pattern ACT2, the second source electrode SE2, and a second drain electrode DE2.

The second gate electrode GE2 may be configured with the second conductive layer, and overlap with the first scan line SC1. The second gate electrode GE2 may be electrically connected to the first scan line SC1 through a corresponding contact hole.

The second active pattern ACT2, the second source electrode SE2, and the second drain electrode DE2 may be configured with a semiconductor pattern made of poly-silicon, amorphous silicon, an oxide semiconductor, or the like. The second source electrode SE2 and the second drain electrode DE2 may be configured with a semiconductor layer doped with an impurity, and the second active pattern ACT2 may be configured with an intrinsic semiconductor layer undoped with the impurity.

The second active pattern ACT2 may be located on the bottom of the second gate electrode GE2, thereby overlapping with the second gate electrode GE2 (e.g., in a thickness direction of the substrate SUB, or the third direction DR3). The second active pattern ACT2 may constitute a channel region of the second transistor T2.

The second source electrode SE2 may be connected to one end of the second active pattern ACT2. The second source electrode SE2 may be electrically connected to the first connection pattern CNP1 through a corresponding contact hole. The first connection pattern CNP1 may electrically connect the second source electrode SE2 and the first gate electrode GE1 to each other.

The second drain electrode DE2 may be connected to the other end of the second active pattern ACT2. The second drain electrode DE2 may be electrically connected to a fourth connection pattern CNP4 through a corresponding contact hole.

The fourth connection pattern CNP4 may be configured with the third conductive layer, and overlap with the second drain electrode DE2 and the data line DL. One end of the fourth connection pattern CNP4 may be electrically connected to the second drain electrode DE2 through a corresponding contact hole. The other end of the fourth connection pattern CNP4 may be electrically connected to the data line DL through a corresponding contact hole. The second drain electrode DE2 and the data line DL may be electrically connected to each other through the fourth connection pattern CNP4.

The third transistor T3 may include a third gate electrode GE3, a third active pattern ACT3, a third source electrode SE3, and a third drain electrode DE3.

The third gate electrode GE3 may be configured with the second conductive layer, and overlap with the second scan line SC2. The third gate electrode GE3 may be electrically connected to the second scan line SC2 through a corresponding contact hole.

The third active pattern ACT3, the third source electrode SE3, and the third drain electrode DE3 may be configured with a semiconductor pattern made of poly-silicon, amorphous silicon, an oxide semiconductor, or the like. The third source electrode SE3 and the third drain electrode DE3 may be configured with a semiconductor layer doped with an impurity, and the third active pattern ACT3 may be configured with an intrinsic semiconductor layer undoped with the impurity.

The third active pattern ACT3 may be located on the bottom of the third gate electrode GE3, thereby overlapping with the third gate electrode GE3 (e.g., in a thickness direction of the substrate SUB, or in the third direction DR3). The third active pattern ACT3 may constitute a channel region of the third transistor T3.

The third source electrode SE3 may be connected to one end of the third active pattern ACT3. The third source electrode SE3 may be electrically connected to the upper electrode UE of the first storage capacitor Cst through a corresponding contact hole.

The third drain electrode DE3 may be connected to the other end of the third active pattern ACT3. The third drain electrode DE3 may be electrically connected to a third connection pattern CNP3 through a corresponding contact hole.

The third connection pattern CNP3 may be configured with the third conductive layer, and overlap with the third drain electrode DE3 and the initialization power line IPL. One end of the third connection pattern CNP3 may be electrically connected to the third drain electrode DE3 through a corresponding contact hole, and the other end of the third connection pattern CNP3 may be electrically connected to the initialization power line IPL through a corresponding contact hole. The third drain electrode DE3 and the initialization power line IPL may be electrically connected to each other through the third connection line CNP3.

The first storage capacitor Cst may include a lower electrode LE and the upper electrode UE. The first storage capacitor Cst may be the storage capacitor Cst described with reference to FIG. 4.

The lower electrode LE may be configured with the second conductive layer, and overlap with the bottom metal pattern BML and the upper electrode UE (e.g., in the third direction DR3) in case that viewed on a plane. In one or more embodiments, the lower electrode LE may be integrally formed with the first gate electrode GE1. The lower electrode LE may be one area of the first gate electrode GE1. The lower electrode LE may be located between the bottom metal pattern BML and the upper electrode UE.

The upper electrode UE may be located while overlapping with the lower electrode LE (e.g., in the third direction DR3), and have a size (or area) greater than a size (or area) of the lower electrode LE. However, the present disclosure is not limited thereto. The upper electrode UE may be configured with the third conductive layer, and overlap with each of the first source electrode SE1 and the third source electrode SE3 (e.g., in the third direction DR3). One area of the upper electrode UE may be electrically connected to the first source electrode SE1 through a corresponding contact hole, and another area of the upper electrode UE may be electrically connected to the third source electrode SE3 through a corresponding contact hole. In addition, still another area of the upper electrode UE may be electrically connected to the bottom metal pattern BML through a corresponding contact hole.

In one or more embodiments, the upper electrode UE may be electrically connected to the first conductive pattern CP1 of the display element layer DPL of the first sub-pixel SPX1 through a first via hole VIH1 (e.g., see FIG. 8). The first via hole VIH1 may be formed as one areas of the fourth and fifth insulating layers INS4 and INS5, which are located between the upper electrode UE and the first conductive pattern CP1, are removed.

The bottom metal pattern BML, the first source electrode SE1, the third source electrode SE3, the upper electrode UE, and the first conductive pattern CP1 may be electrically connected to each other.

The pixel circuit PXC of the second sub-pixel SPX2 may include a first transistor T1, a second transistor T2, a third transistor T3, and a storage capacitor Cst (hereinafter, referred to as a "second storage capacitor").

The first transistor T1 may include a first gate electrode GE1, a first active pattern ACT1, a first source electrode SE1, and a first drain electrode DE1. The first transistor T1 may be configured identically (or substantially similar) to the first transistor T1 of the first sub-pixel SPX1.

The second transistor T2 may include a second gate electrode GE2, a second active pattern ACT2, a second source electrode SE2, and a second drain electrode DE2. The second transistor T2 may be configured identically (or substantially similar) to the second transistor T2 of the first sub-pixel SPX1.

The third transistor T3 may include a third gate electrode GE3, a third active pattern ACT3, a third source electrode SE3, and a third drain electrode DE3. The third transistor T3 may be configured identically (or substantially similar) to the third transistor T3 of the first sub-pixel SPX1.

The second storage capacitor Cst may include a lower electrode LE and an upper electrode UE.

The lower electrode LE may be configured identically (or substantially similar) to the lower electrode LE of the first storage capacitor Cst of the first sub-pixel SPX1.

The upper electrode UE may be configured with the third conductive layer, and overlap with the lower electrode LE (e.g., in the third direction DR3). The upper electrode UE may be electrically connected to each of the first source electrode SE1 and the third source electrode SE3 through a corresponding contact hole. Also, the upper electrode LE may be electrically connected to the bottom metal pattern BML overlapping with the first transistor T1 through a corresponding contact hole.

In one or more embodiments, the upper electrode UE may be electrically connected to the second conductive pattern CP2 of the display element layer DPL through a fifth via hole VIH5 (e.g., see FIG. 9). The fifth via hole VIH5 may be formed as one areas of the fourth and fifth insulating layers INS4 and INS5, which are located between the upper electrode UE and the second conductive pattern CP2, are removed.

The bottom metal pattern BML, the first source electrode SE1, the third source electrode SE3, the upper electrode UE, and the second conductive pattern CP2 may be electrically connected to each other.

The pixel circuit PXC of the third sub-pixel SPX3 may include a first transistor T1, a second transistor T2, a third transistor T3, and a storage capacitor Cst (hereinafter, referred to as a "third storage capacitor").

The first transistor T1 may include a first gate electrode GE1, a first active pattern ACT1, a first source electrode SE1, and a first drain electrode DE1. The first transistor T1 may be configured identically (or substantially similar) to the first transistor T1 of the first sub-pixel SPX1.

The second transistor T2 may include a second gate electrode GE2, a second active pattern ACT2, a second source electrode SE2, and a second drain electrode DE2. The second transistor T2 may be configured identically (or substantially similar) to the second transistor T2 of the first sub-pixel SPX1.

The third transistor T3 may include a third gate electrode GE3, a third active pattern ACT3, a third source electrode SE3, and a third drain electrode DE3. The third transistor T3 may be configured identically (or substantially similar) to the third transistor T3 of the first sub-pixel SPX1.

The third storage capacitor Cst may include a lower electrode LE and an upper electrode UE.

The lower electrode LE may be configured identically (or substantially similar) to the lower electrode LE of the first storage capacitor Cst of the first sub-pixel SPX1.

The upper electrode UE may be configured with the third conductive layer, and overlap with the lower electrode LE (e.g., in the third direction DR3). The upper electrode UE may be electrically connected to each of the first source electrode SE1 and the third source electrode SE3 through a corresponding contact hole. Also, the upper electrode LE may be electrically connected to the bottom metal pattern BML overlapping with the first transistor T1 through a corresponding contact hole.

In one or more embodiments, the upper electrode UE may be electrically connected to the eleventh conductive pattern CP11 of the display element layer DPL through an eleventh via hole VIH11 (e.g., see, FIG. 9). The eleventh via hole VIH11 may be formed as one areas of the fourth and fifth insulating layers INS4 and INS5, which are located between the upper electrode UE and the eleventh conductive pattern CP11, are removed.

The pixel circuit PXC of the above-described first sub-pixel SPX1 may be electrically connected to the first emission component EMU1. For example, the upper electrode UE of the first storage capacitor Cst of the pixel circuit PXC may be electrically connected to a first electrode EL1 of the first emission component EMU1 through the first via hole VIH1 and the first conductive pattern CP1 (e.g., see FIG. 9).

The pixel circuit PXC of the above-described second sub-pixel SPX2 may be electrically connected to the second emission component EMU2. For example, the upper electrode UE of the second storage capacitor Cst of the pixel circuit PXC may be electrically connected to a second electrode EL2 of the second emission component EMU2 through the fifth via hole VIH5, the second conductive pattern CP2, and the second line LP2 located in the first line area LA1.

The pixel circuit PXC of the above-described third sub-pixel SPX3 may be electrically connected to the third emission component EMU3. For example, the upper electrode UE of the third storage capacitor Cst of the pixel circuit PXC may be electrically connected to a third electrode EL3 of the third emission component EMU3 through the eleventh via hole VIH11 and the eleventh conductive pattern CP11.

Hereinafter, components located in the display element layer DPL of the pixel PXL will be described in detail with reference to FIGS. 9 to 13.

The pixel PXL may include the first emission component EMU1, the second emission component EMU2, and the third emission component EMU3, which are located in the display element layer DPL. Each of the first to third emission components EMU1, EMU2, and EMU3 may include integrated light-emitting elements IT_LD electrically connected to a corresponding pixel circuit PXC to emit light and electrodes EL (or electrode patterns) electrically connected to the integrated light-emitting elements IT_LD.

The first sub-pixel SPX1 may include a first emission area EMA1 and a non-emission area NEA around at least one side of the first emission area EMA1. The second sub-pixel SPX2 may include a second emission area EMA2 and a non-emission area NEA around at least one side of the second emission area EMA2. The third sub-pixel SPX3 may include a third emission area EMA3 and a non-emission area NEA around at least one side of the third emission area EMA3.

The display element layer DPL may include a first bank BNK1 located in the non-emission area NEA.

The first bank BNK1 is a structure defining (or partitioning) the first, second, and third emission areas EMA1, EMA2, and EMA3, and may be a pixel defining layer. For example, the first bank BNK1 may be a structure defining an emission area of each of adjacent sub-pixels (see "SPX" shown in FIG. 3). The first bank BNK1 may define a supply position of integrated light-emitting elements IT_LD in a process of supplying (or inputting) the integrated light-emitting elements IT_LD to each of the first to third sub-pixels SPX1, SPX2, and SPX3. For example, an emission area of each sub-pixel SPX is partitioned (or defined) by the first bank BNK1, so that a mixed liquor (e.g., an ink) including a desired quantity of integrated light-emitting elements IT_LD can be supplied (or input) to the corresponding emission area.

The first bank BNK1 includes at least one light-blocking material and/or at least one reflective material (or light scattering material), to reduce or prevent the likelihood of a light leakage defect in which light (or beam) is leaked between adjacent sub-pixels SPX. In one or more embodiments, the first bank BNK1 may include a transparent material (or substance). The transparent material may include, for example, one or more selected from among polyamide resin, polyimide resin, and/or the like, but the present disclosure is not limited thereto.

The first bank BNK1 may include opening areas OP exposing components located thereunder in the pixel area PXA. In one or more embodiments, the first to third emission areas EMA1, EMA2, and EMA3 may be respectively defined by the opening areas of the first bank BNK1. The first to third emission areas EMA1, EMA2, and EMA3 may respectively correspond to the opening areas OP of the first bank BNK1.

Each of the first, second, and third emission components EMU1, EMU2, and EMU3 may include electrodes EL, integrated light-emitting elements IT_ID electrically connected to the electrodes EL, and alignment electrodes ALE provided at positions corresponding to the electrodes EL. For example, each of the first, second, and third emission components EMU1, EMU2, and EMU3 may include first to fourth electrodes EL1 to EL4, integrated light-emitting elements IT_LD, and first to fourth alignment electrodes ALE1 to ALE4. The number, shape, size, alignment structure, and the like of the electrodes EL and/or the alignment electrodes ALE may be variously changed according to a structure of the first, second, and third sub-pixels SPX1, SPX2, and SPX3 (for example, the first, second, and third emission components EMU1, EMU2, and EMU3).

In one or more embodiments, each of the first, second, and third emission components EMU1, EMU2, and EMU3 may include conductive patterns. The conductive patterns may be configured with the fourth conductive layer, and may be located between the pixel circuit layer PCL (or the fifth insulating layer INS5) and the alignment electrodes ALE. The conductive patterns may be connection members for electrically connecting a pixel circuit PXC and a corresponding emission component to each other. In one or more embodiments, the conductive patterns may include first to twelfth conductive patterns CP1 to CP12 located to be spaced from each other.

The first conductive pattern CP1 may be electrically connected to the upper electrode UE of the first sub-pixel SPX1 through the first via hole VIH1. The first conductive pattern CP1 may be electrically connected to the first line LP1 located in the second line area LA2 through the second via hole VIH2. The first conductive pattern CP1 may be electrically connected to a first electrode EL1 of the first emission component EMU1 through a first contact hole CH1. The first contact hole CH1 may be formed as one areas of the sixth and seventh insulating layers INS6 and INS7, which are located between the first electrode EL1 and the first conductive pattern CP1, are removed.

The second conductive pattern CP2 may be electrically connected to the upper electrode UE of the second sub-pixel SPX2 through the fifth via hole VIH5. The second conductive pattern CP2 may be electrically connected to the second line LP2 located in the first line area LA1 through the sixth via hole VIH6. The second conductive pattern CP2 may be electrically connected to a second electrode EL2 of the first emission component EMU1 through a first opening OPN1. The first opening OPN1 may be formed as one areas of the sixth to eighth insulating layers INS6, INS7, and INS8, which are located between the second electrode EL2 and the second conductive pattern CP2, are removed.

The third conductive pattern CP3 may be electrically connected to the third line LP3 located in the first line area LA1 through the third via hole VIH3. The third conductive pattern CP3 may be electrically connected to a third electrode EL3 of the first emission component EMU1 through a second opening OPN2. The second opening OPN2 may be formed as one areas of the sixth to eighth insulating layers INS6, INS7, and INS8, which are located between the third conductive pattern CP3 and the third electrode EL3, are removed.

The fourth conductive pattern CP4 may be electrically connected to the fourth line LP4 located in the second line area LA2 through the fourth via hole VIH4. The fourth conductive pattern CP4 may be electrically connected to a fourth electrode EL4 of the first emission component EMU1 through a second contact hole CH2. The second contact hole CH2 may be formed as one areas of the sixth and seventh insulating layers INS6 and INS7, which are located between the fourth conductive pattern CP4 and the fourth electrode EL4, are removed.

The fifth conductive pattern CP5 may be electrically connected to the first line LP1 located in the second line area LA2 through the seventh via hole VIH7. The fifth conductive pattern CP5 may be electrically connected to a first electrode EL1 of the second emission component EMU2 through a third contact hole CH3. The third contact hole CH3 may be formed as one areas of sixth and seventh insulating layers INS6 and INS7, which are located between the fifth conductive pattern CP5 and the first electrode EL1, are removed.

The sixth conductive pattern CP6 may be electrically connected to the second line LP2 located in the first line area LA1 through the tenth via hole VIH10. The sixth conductive pattern CP6 may be electrically connected to a second electrode of the second emission component EMU2 through a third opening OPN3. The third opening OPN3 may be formed as one areas of the sixth to eighth insulating layers INS6, INS7, and INS8, which are located between the sixth conductive pattern CP6 and the second electrode EL2, are removed.

The seventh conductive pattern CP7 may be electrically connected to the third line LP3 located in the first line area LA1 through the eighth via hole VIH8. The seventh conductive pattern CP7 may be electrically connected to a third electrode EL3 of the second emission component EMU3 through a fourth opening OPN4. The fourth opening OPN4 may be formed as one areas of the sixth to eighth insulating layers INS6, INS7, and INS8, which are located between the seventh conductive pattern CP7 and the third electrode EL3, are removed.

The eighth conductive pattern CP8 may be electrically connected to the fourth line LP4 located in the second line area LA2 through the ninth via hole VIH9. The eighth conductive pattern CP8 may be electrically connected to a fourth electrode EL4 of the second emission component EMU2 through a fourth contact hole CH4. The fourth contact hole CH4 may be formed as one areas of the sixth and seventh insulating layers INS6 and INS7, which are located between the eighth conductive pattern CP8 and the fourth electrode EL4, are removed.

The ninth conductive pattern CP9 may be electrically connected to the first line LP1 located in the second line area LA2 through the thirteenth via hole VIH13. The ninth conductive pattern CP9 may be electrically connected to a first electrode EL1 of the third emission component EMU3 through a fifth contact hole CH5. The fifth contact hole CH5 may be formed as one areas of the sixth and seventh insulating layers INS6 and INS7, which are located between the ninth conductive pattern CP9 and the first electrode EL1, are removed.

The tenth conductive pattern CP10 may be electrically connected to the second line LP2 located in the first line area LA1 through the fourteenth via hole VIH14. The tenth conductive pattern CP10 may be electrically connected to a second electrode EL2 of the third emission component EMU3 through a fifth opening OPN5. The fifth opening OPN5 may be formed as one areas of the sixth to eighth insulating layers INS6, INS7, and INS8, which are located between the tenth conductive pattern CP10 and the second electrode EL2, are removed.

The eleventh conductive pattern CP11 may be electrically connected to the third line LP3 located in the first line area LA1 through the twelfth via hole VIH12. The eleventh conductive pattern CP11 may be electrically connected to a third electrode EL3 of the third emission component EMU3 through a sixth opening OPN6. The sixth opening OPN6 may be formed as one areas of the sixth to eighth insulating layers INS6, INS7, and INS8, which are located between the eleventh conductive pattern CP11 and the third electrode EL3, are removed.

The twelfth conductive pattern CP12 may be electrically connected to the fourth line LP4 located in the second line area LA2 through the fifteenth via hole VIH15. The twelfth conductive pattern CP12 may be electrically connected to a fourth electrode EL4 of the third emission component EMU3 through a sixth contact hole CH6. The sixth contact hole CH6 may be formed as one areas of the sixth and seventh insulating layers INS6 and INS7, which are located between the twelfth conductive pattern CP12 and the fourth electrode EL4, are removed.

In one or more embodiments, each of the first conductive pattern CP1, the fifth conductive pattern CP5, and the ninth conductive pattern CP9 may be a first bridge pattern BRP1 electrically connecting a first electrode EL1 of each of the first to third sub-pixels SPX1, SPX2, and SPX3 and the first line LP1 to each other. For example, the first conductive pattern CP1 may be a first bridge pattern BRP1 electrically connecting a first electrode EL1 of the first sub-pixel SPX1 and the first line LP1 to each other, the fifth conductive pattern CP5 may be a first bridge pattern BRP1 electrically connecting a first electrode EL1 of the second sub-pixel SPX2 and the first line LP1 to each other, and the ninth conductive pattern CP9 may be a first bridge electrode BRP1 electrically connecting a first electrode of the third sub-pixel SPX3 and the first line LP1 to each other.

In one or more embodiments, each of the second conductive pattern CP2, the sixth conductive pattern CP6, and the tenth conductive pattern CP10 may be a second bridge pattern BRP2 electrically connecting a second electrode EL2 of each of the first to third sub-pixels SPX1, SPX2, and SPX3 and the second line LP2 to each other. For example, the second conductive pattern CP2 may be a second bridge pattern BRP2 electrically connecting a second electrode EL2 of the first sub-pixel SPX1 and the second line LP2 to each other, the sixth conductive pattern CP6 may be a second bridge pattern BRP2 electrically connecting a second electrode EL2 of the second sub-pixel SPX2 and the second line LP2 to each other, and the tenth conductive pattern CP10 may be a second bridge pattern BRP2 electrically connecting a second electrode EL2 of the third sub-pixel SPX3 and the second line LP2 to each other.

In one or more embodiments, each of the third conductive pattern CP3, the seventh conductive pattern CP7, and the eleventh conductive pattern CP11 may be a third bridge pattern BRP3 electrically connecting a third electrode EL3 of each of the first to third sub-pixels SPX1, SPX2, and SPX3 and the third line LP3 to each other. For example, the third conductive pattern CP3 may be a third bridge pattern BRP3 electrically connecting a third electrode EL3 of the first sub-pixel SPX1 and the third line LP3 to each other, the seventh conductive pattern CP7 may be a third bridge pattern BRP3 electrically connecting a third electrode EL3 of the second sub-pixel SPX2 and the third line LP3 to each other, and the eleventh conductive pattern CP11 may be a third bridge pattern BRP3 electrically connecting a third electrode EL3 of the third sub-pixel SPX3 and the third line LP3 to each other.

In one or more embodiments, each of the fourth conductive pattern CP4, the eighth conductive pattern CP8, and the twelfth conductive pattern CP12 may be a fourth bridge pattern BRP4 electrically connecting a fourth electrode EL4 of each of the first to third sub-pixels SPX1, SPX2, and SPX3 and the fourth line LP4 to each other. For example, the fourth conductive pattern CP4 may be a fourth bridge pattern BRP4 electrically connecting a fourth electrode EL4 of the first sub-pixel SPX1 and the fourth line LP4 to each other, the eighth conductive pattern CP8 may be a fourth bridge pattern BRP4 electrically connecting a fourth electrode EL4 of the second sub-pixel SPX2 and the fourth line LP4 to each other, and the twelfth conductive pattern CP12 may be a fourth bridge pattern BRP4 electrically connecting a fourth electrode EL4 of the third sub-pixel SPX3 and the fourth line LP4 to each other.

The sixth insulating layer INS6 may be provided and/or formed over the above-described first to twelfth conductive patterns CP1 to CP12.

The alignment electrode ALE may be the fifth conductive layer. The alignment electrode ALE may include first to fourth alignment electrodes ALE1 to ALE4 arranged to be spaced from each other in the first direction DR1. The alignment electrode ALE may extend in the second direction DR2. The first alignment electrode ALE1, the third alignment electrode ALE3, the fourth alignment electrode ALE4, and the second alignment electrode ALE2 may be sequentially arranged along the first direction DR1 in each of at least the first, second, and third emission areas EMA1, EMA2, and EMA3. The first to fourth alignment electrodes ALE1 to ALE4 may be provided in a bar-like shape that extends in the second direction DR2 and has a constant width in the first direction DR1.

The alignment electrode ALE may receive a suitable alignment signal (e.g., a predetermined alignment signal) before integrated light-emitting elements LD are aligned in each of the first, second, and third emission areas EMA1, EMA2, and EMA3 to be used as an electrode (or alignment line) for alignment of the integrated light-emitting elements IT_LD. In an alignment process of the integrated light-emitting elements IT_LD, the first and second alignment electrodes ALE1 and ALE2 may receive a first alignment signal, and the third and fourth alignment electrodes ALE3 and ALE4 may receive a second alignment signal.

The above-described first and second alignment signals may be signals having a voltage difference and/or a phase difference to a degree to which the integrated light-emitting elements IT_LD can be aligned between the alignment electrodes ALE. At least one of the first and second alignment signals may be an AC signal, but the present disclosure is not limited thereto.

A second alignment electrode ALE2 of each sub-pixel SPX (or each emission component) may be integrally formed with a first alignment electrode ALE1 of an adjacent sub-pixel SPX. For example, a second alignment electrode ALE2 of the first sub-pixel SPX1 (or the first emission component EMU1) may be integrally formed with a first alignment electrode ALE1 of the second sub-pixel SPX2 (or the second emission component EMU2), and a second alignment electrode ALE2 of the second sub-pixel SPX2 may be integrally formed with a first alignment electrode ALE1 of the third sub-pixel SPX3 (or the third emission component EMU3). In addition, a third alignment electrode ALE3 and a fourth alignment electrode ALE4 in each sub-pixel SPX may be integrally formed.

Third and fourth alignment electrodes ALE3 and ALE4 of each emission component may be electrically connected to the fourth line LP4 of a corresponding sub-pixel SPX through a corresponding through hole. For example, third and fourth alignment electrodes ALE3 and ALE4 of the first emission component EMU1 may be electrically connected to the fourth line LP4 through the first through hole TH1, third and fourth alignment electrodes ALE3 and ALE4 of the second emission component EMU2 may be electrically connected to the fourth line LP4 through the second through hole TH2, and third and fourth alignment electrodes ALE3 and ALE4 of the third emission component EMU3 may be electrically connected to the fourth line LP4 through the third through hole TH3.

The alignment electrode ALE may be configured with a material having a reflexibility (or predetermined reflexibility) to allow light emitted from integrated light-emitting elements IT_LD to advance in an image display direction of the display device DD (e.g., the third direction DR3). For example, the alignment electrode ALE may be configured with a conductive material (or substance). The conductive material may include an opaque metal suitable to allow light emitted from the integrated light-emitting elements IT_LD to be reflected in the image display direction of the display device DD (e.g., the third direction DR3) or an upper direction of the display element layer DPL).

The alignment electrode ALE may be provided and/or formed as a single layer, but the present disclosure is not limited thereto.

The alignment electrode ALE may be separated from another electrode (e.g., an alignment electrode ALE provided in an adjacent sub-pixel SPX in the second direction DR2) after integrated light-emitting elements IT_LD are supplied and aligned in each of the first to third emission areas EMA1, EMA2, and EMA3 in a manufacturing process of the display device DD.

The seventh insulating layer INS7 may be provided and/or formed over the alignment electrode ALE.

The first bank BNK1 may be provided and/or formed on the seventh insulating layer INS7.

The first bank BNK1 may be provided and/or formed on the seventh insulating layer INS7 in the non-emission area NEA. The first bank BNK1 may surround each of the first to third emission areas EMA1, EMA2, and EMA3.

In each of the first to third emission areas EMA1, EMA2, and EMA3, a plurality of integrated light-emitting elements IT_LD may be aligned and/or located on the seventh insulating layer INS7. Each of the integrated light-emitting elements IT_LD may be the integrated light-emitting element IT_LD described with reference to FIGS. 5 and 6.

Each of the integrated light-emitting elements IT_LD may include a first light-emitting element LD1, a second light-emitting element LD2, and a third light-emitting element LD3, which are coupled to each other by a shape memory polymer SMP. In one or more embodiments, the first light-emitting element LD1 may have a length longer than lengths of the second and third light-emitting elements LD2 and LD3, but the present disclosure is not limited thereto.

Each of the first to third light-emitting elements LD1, LD2, and LD3 may include a first end portion EP1 and a second end portion EP2, which are opposite each other in an extending direction (or length direction) thereof. The shape memory polymer SMP may be coupled to a second end portion EP2 of the first light-emitting element LD1, a second end portion EP2 of the second light-emitting element LD2, and a second end portion EP2 of the third light-emitting element LD3 in a process in which the shape memory polymer SMP returns to a specific shape by means of an applied stimulus, or the like.

The first light-emitting element LD1 may emit one color light from among light of a first color (e.g., red light), light of a second color (e.g., green light), and light of a third color (e.g., blue light). For example, the first light-emitting element LD1 may include a red light-emitting diode emitting red light. A buffer semiconductor layer may be located at each of a first end portion EP1 and the second end portion EP2 of the first light-emitting element LD1.

The second light-emitting element LD2 may emit one color light from among light of a first color (e.g., red light), light of a second color (e.g., green light), and light of a third color (e.g., blue light). For example, the second light-emitting element LD2 may include a green light-emitting diode emitting green light. A p-type semiconductor layer may be located at a first end portion EP1 of the second light-emitting element LD2, and an n-type semiconductor layer may be located at the second end portion EP2 of the second light-emitting element LD2. A low concentration n-type impurity may be doped into the first end portion EP1 of the second light-emitting element LD2, at which the p-type semiconductor layer is located. The n-type impurity may be doped to a degree to which the n-type impurity has no influence in case that the second light-emitting element LD2 is normally driven to emit green light.

The third light-emitting element LD3 may emit one color light from among light of a first color (e.g., red light), light of a second color (e.g., green light), and light of a third color (e.g., blue light). For example, the third light-emitting element LD3 may include a blue light-emitting diode emitting blue light. A p-type semiconductor layer may be located at a first end portion EP1 of the third light-emitting element LD3, and an n-type semiconductor layer may be located at the second end portion EP2 of the third light-emitting element LD3.

Each integrated light-emitting element IT_LD including first to third light-emitting elements LD1, LD2, and LD3 coupled to each other by a shape memory polymer SMP may aligned and located in a desired area of each of the first to third emission areas EMA1, EMA2, and EMA3 by an electric field formed as an alignment signal corresponding to each of first to fourth alignment electrodes ALE1 to ALE4 is applied. In each integrated light-emitting element IT_LD, a first end portion EP1 of the second light-emitting element LD2 doped with an n-type impurity may be adjacent to the second alignment electrode ALE2 (or the first alignment electrode ALE1) to which a first alignment signal (e.g., an AC signal) is applied, and a first end portion EP1 of the third light-emitting element LD3 may be adjacent to the third alignment electrode ALE3 (or the fourth alignment electrode ALE4) to which a second alignment signal (e.g., a ground voltage) is applied. As described above, in case that a position of the first end portion EP1 of each of the second and third light-emitting elements LD2 and LD3 is determined, a position of a first end portion EP1 of the first light-emitting element LD1 and a position of a second end portion EP2 of each of the first to third light-emitting elements LD1, LD2, and LD3 may be determined.

Each of the first to third light-emitting elements LD1, LD2, and LD3 may be a light-emitting diode having a subminiature size, e.g., a size small to a degree of nanometer scale to micrometer scale, which is manufactured by using a material having an inorganic crystalline structure.

An insulating pattern INSP may be located on each of first to third light-emitting elements LD1, LD2, and LD3 of each integrated light-emitting element IT_LD. However, the present disclosure is not limited thereto. In one or more embodiments, the insulating pattern INSP may be located on at least one of the first to third light-emitting elements LD1, LD2, or LD3. The insulating pattern INSP may include an inorganic insulating layer including an inorganic material or an organic insulating layer. The insulating pattern INSP is located on the top of an active layer 12 of each of the first to third light-emitting elements LD1, LD2, and LD3, thereby more stably protect the active layer 12.

In case that a gap (or space) exists between the seventh insulating layer INS7 and the integrated light-emitting element IT_LD before the insulating pattern INSP is formed, the gap may be filled with the insulating pattern INSP in a process of forming the insulating pattern INSP.

Electrodes EL may be formed on the first and second end portions EP1 and EP2 of each of the first to third light-emitting elements LD1, LD2, and LD3, which are not covered by the insulating pattern INSP.

The electrodes EL may include a first electrode EL1, a second electrode EL2, a third electrode EL3, and a fourth electrode EL4. The first electrode EL1, the third electrode EL3, the fourth electrode EL4, and the second electrode EL2 may be sequentially arranged along the first direction DR1 in each of at least the first, second, and third emission areas EMA1, EMA2, and EMA3. The first to fourth electrodes EL1 to EL4 may be provided in a bar-like shape that extends in the second direction DR2 and has a constant width in the first direction DR1, but the present disclosure is not limited thereto. The first electrode EL1 and the fourth electrode EL4 may be located in the same layer, and the second electrode EL2 and the third electrode EL3 may be located in the same layer. For example, the first and fourth electrodes EL1 and EL4 may be the sixth conductive layer located between the seventh insulating layer INS7 and the eighth insulating layer INS8, and the second and third electrodes EL2 and EL3 may be the seventh conductive layer located on the eighth insulating layer INS8. However, the present disclosure is not limited thereto. In one or more embodiments, the opposite case may be possible.

In each of the first to third emission areas EMA1, EMA2, and EMA3, a first electrode EL1 may overlap with a first alignment electrode ALE1 located in the corresponding emission area. The first electrode EL1 may be directly located on a first end portion EP1 of a first light-emitting element LD1 of each integrated light-emitting element IT_LD in each of the first to third emission areas EMA1, EMA2, and EMA3 to be electrically and physically connected to the first end portion EP1 of the first light-emitting element LD1.

A first electrode EL1 of the first emission component EMU1 may be electrically connected to the first conductive pattern CP1 through the first contact hole CH1. The first electrode EL1 may be electrically connected to the upper electrode UE of the first sub-pixel SPX1 and the first line LP1 located in the second line area LA2 through the first conductive pattern CP1.

A first electrode EL1 of the second emission component EMU2 may be electrically connected to the fifth conductive pattern CP5 through the third contact hole CH3. The first electrode EL1 may be electrically connected to the first line LP1 located in the second line area LA2 through the fifth conductive pattern CP5.

A first electrode EL1 of the third emission component EMU3 may be electrically connected to the ninth conductive pattern CP9 through the fifth contact hole CH5. The first electrode EL1 may be electrically connected to the first line LP1 located in the second line area LA2 through the ninth conductive pattern CP9.

The first electrode EL1 of the first emission component EMU1, the first electrode EL1 of the second emission component EMU2, and the first electrode EL1 of the third emission component EMU3 may be electrically connected to each other through the first line LP1, and each may be supplied with a signal applied to the upper electrode UE of the first sub-pixel SPX.

In each of the first to third emission areas EMA1, EMA2, and EMA3, a second electrode EL2 may overlap with a second alignment electrode ALE2 located in the corresponding emission area. The second electrode EL2 may be directly located on a first end portion EP1 of a second light-emitting element LD2 of each integrated light-emitting element IT_LD in each of the first to third emission areas EMA1, EMA2, and EMA3 to be electrically and physically connected to the first end portion EP1 of the second light-emitting element LD2.

A second electrode EL2 of the first emission component EMU1 may be electrically connected to the second conductive pattern CP2 through the first opening OPN1. The second electrode EL2 may be electrically connected to the upper electrode UE of the second sub-pixel SPX2 and the second line LP2 located in the first line area LA1 through the second conductive pattern CP2.

A second electrode EL2 of the second emission component EMU2 may be electrically connected to the sixth conductive pattern CP6 through the third opening OPN3. The second electrode EL2 may be electrically connected to the second line LP2 located in the first line area LA1 through the sixth conductive pattern CP6.

A second electrode EL2 of the third emission component EMU3 may be electrically connected to the tenth conductive pattern CP10 through the fifth opening OPN5. The second electrode EL2 may be electrically connected to the second line LP2 located in the first line area LA1 through the tenth conductive pattern CP10.

The second electrode EL2 of the first emission component EMU1, the second electrode EL2 of the second emission component EMU2, and the second electrode EL2 of the third emission component EMU3 may be electrically connected to each other through the second line LP2, and each may be supplied with a signal applied to the upper electrode UE of the second sub-pixel SPX2.

In each of the first to third emission areas EMA1, EMA2, and EMA3, a third electrode EL3 may overlap with a third alignment electrode ALE3 located in the corresponding emission area. The third electrode EL3 may be directly located on a first end portion EP1 of a third light-emitting element LD3 of each integrated light-emitting element IT_LD in each of the first to third emission areas EMA1, EMA2, and EMA3 to be electrically and physically connected to the first end portion EP1 of the third light-emitting element LD3.

A third electrode EL3 of the first emission component EMU1 may be electrically connected to the third conductive pattern CP3 through the second opening OPN2. The third electrode EL3 may be electrically connected to the third line LP3 located in the first line area LA1 through the third conductive pattern CP3.

A third electrode EL3 of the second emission component EMU2 may be electrically connected to the seventh conductive pattern CP7 through the fourth opening OPN4. The third electrode EL3 may be electrically connected to the third line LP3 located in the first line area LA1 through the seventh conductive pattern CP7.

A third electrode EL3 of the third emission component EMU3 may be electrically connected to the eleventh conductive pattern CP11 through the sixth opening OPN6. The third electrode EL3 may be electrically connected to the third line LP3 located in the first line area LA1 through the eleventh conductive pattern CP11.

The third electrode EL3 of the first emission component EMU1, the third electrode EL3 of the second emission component EMU2, and the third electrode EL3 of the third emission component EMU3 may be electrically connected to each other through the third line LP3, and each may be supplied with a signal applied to the upper electrode UE of the third sub-pixel SPX3.

In each of the first to third light-emitting areas EMA1, EMA2, and EMA3, a fourth electrode EL4 may overlap with a fourth alignment electrode ALE4 located in the corresponding emission area. The fourth electrode EL4 may be directly located on a second end portion EP2 (or a shape memory polymer SMP) of first to third light-emitting elements LD1, LD2, and LD3 of each integrated light-emitting element IT_LD in each of the first to third light-emitting areas EMA1, EMA2, and EMA3 to be electrically and physically connected to the second end portion EP2 of each of the first to third light-emitting elements LD1, LD2, and LD3.

A fourth electrode EL4 of the first emission component EMU1 may be electrically connected to the fourth conductive pattern CP4 through the second contact hole CH2. The fourth electrode EL4 may be electrically connected to the fourth line LP4 located in the second line area LA2 through the fourth conductive pattern CP4.

A fourth electrode EL4 of the second emission component EMU2 may be electrically connected to the eighth conductive pattern CP8 through the fourth contact hole CH4. The fourth electrode EL4 may be electrically connected to the fourth line LP4 located in the second line area LA2 through the eighth conductive pattern CP8.

A fourth electrode EL4 of the third emission component EMU3 may be electrically connected to the twelfth conductive pattern CP12 through the sixth contact hole CH6. The fourth electrode EL4 may be electrically connected to the fourth line LP4 located in the second line area LA2 through the twelfth conductive pattern CP12.

The fourth electrode EL4 of the first emission component EMU1, the fourth electrode EL4 of the second emission component EMU2, and the fourth electrode EL4 of the third emission component EMU3 may be electrically connected to each other through the fourth line LP4, and may be supplied with the voltage of the second driving power source VSS, applied to a second power line PL2 of a corresponding sub-pixel SPX.

Each of the first to fourth electrodes EL1, EL2, EL3, and EL4 may be configured with various transparent conductive materials. For example, each of the first to fourth electrodes EL1, EL2, EL3, and EL4 may include at least one transparent conductive material selected from among Indium Tin Oxide (ITO), Indium Zinc Oxide (IZO), Indium Tin Zinc Oxide (ITZO), Aluminum Zinc Oxide (AZO), Gallium Zinc Oxide (GZO), Zinc Tin Oxide (ZTO), and/or Gallium Tin Oxide (GTO), and may be implemented substantially transparently or translucently to satisfy a desired transmittance (e.g., a predetermined transmittance).

In one or more embodiments, the mutual positions and/or formation order of the first electrode EL1, the second electrode EL2, the third electrode EL3, and the fourth electrode EL4 may be variously changed in one or more embodiments. For example, the first electrode EL1 and the fourth electrode EL4 may be configured with the sixth conductive layer provided and/or formed on the seventh insulating layer INS7, and the second and third electrodes EL2 and EL3 may be configured with the seventh conductive layer provided and/or formed on the eighth insulating layer INS8. The first and fourth electrodes EL1 and EL4 may be first formed on the seventh insulating layer INS7. The first electrode EL1 may be in direct contact with a first end portion EP1 of a first light-emitting element LD1 of each integrated light-emitting element IT_LD, and the fourth electrode EL4 may be in direct contact with a second end portion EP2 of each of first to third light-emitting elements LD1, LD2, and LD3 of each of the integrated light-emitting element IT_LD. After that, the eighth insulating layer INS8 may be formed to cover the first electrode EL1 and the fourth electrode EL4.

The eighth insulating layer INS8 covers the first and fourth electrodes EL1 and EL4, thereby reducing or preventing corrosion or the like of the first and fourth electrodes EL1 and EL4. The second and third electrodes EL2 and EL3 may be formed on the eighth insulating layer INS8. The eighth insulating layer INS8 may be partially opened to expose a first end portion EP1 of each of second and third light-emitting elements LD2 and LD3 in each of the first, second, and third emission areas EMA1, EMA2, and EMA3. The second electrode EL2 may be in direct contact with a first end portion EP1 of a second light-emitting element LD2 of each integrated light-emitting element IT_LD, and the third electrode EL3 may be in direct contact with a first end portion EP1 of a third light-emitting element LD3 of each integrated light-emitting element IT_LD.

In one or more embodiments, as shown in FIG. 13, the second and third electrodes EL2 and EL3 may be first formed on the seventh insulating layer INS7. After that, the eighth insulating layer INS8 may be formed to cover the second and third electrodes EL2 and EL3, and the first and fourth electrodes EL1 and EL4 may be formed on the eighth insulating layer INS8.

In each of the first to third emission components EMU1, EMU2, and EMU3, a first electrode EL1 may be electrically connected to a first end portion EP1 of a first light-emitting element LD1 of each integrated light-emitting elements IT_LD, and a fourth electrode EL4 may be electrically connected to a second end portion EP2 of the first light-emitting element LD1. The first electrode EL1 may be an anode of the first light-emitting element LD1, and the fourth electrode EL4 may be a cathode of the first light-emitting element LD1. The first electrode EL1 may be the first pixel electrode PE1 described with reference to FIG. 4, and the fourth electrode EL4 may be the second pixel electrode PE2 described with reference to FIG. 4.

In each of the first to third emission components EMU1, EMU2, and EMU3, a second electrode EL2 may be electrically connected to a first end portion EP1 of a second light-emitting element LD2 of each integrated light-emitting elements IT_LD, and a fourth electrode EL4 may be electrically connected to a second end portion EP2 of the second light-emitting element LD2. The second electrode EL2 may be an anode of the second light-emitting element LD2, and the fourth electrode EL4 may be a cathode of the second light-emitting element LD2. The second electrode EL2 may be the first pixel electrode PE1 described with reference to FIG. 4, and the fourth electrode EL4 may be the second pixel electrode PE2 described with reference to FIG. 4.

In each of the first to third emission components EMU1, EMU2, and EMU3, a third electrode EL3 may be electrically connected to a first end portion EP1 of a third light-emitting element LD3 of each integrated light-emitting elements IT_LD, and a fourth electrode EL4 may be electrically connected to a second end portion EP2 of the third light-emitting element LD3. The third electrode EL3 may be an anode of the third light-emitting element LD3, and the fourth electrode EL4 may be a cathode of the third light-emitting element LD3. The third electrode EL3 may be the first pixel electrode PE1 described with reference to FIG. 4, and the fourth electrode EL4 may be the second pixel electrode PE2 described with reference to FIG. 4.

In case that a driving current flows from the first power line PL1 to the second power line PL2 by a first transistor T1 in a pixel circuit PXC of each of the first to third sub-pixels SPX1, SPX2, and SPX3, the driving current may be introduced to the first to third emission components EMU1, EMU2, and EMU3 through each of the first via hole VIH1, the fifth via hole VIH5, and the eleventh via hole VIH11.

In case that a driving current is supplied to the first electrode EL1 of the first emission component EMU1 through the first via hole VIH1, the driving current flows into the fourth electrode EL4 via first light-emitting elements LD1 of integrated light-emitting elements IT_LD through the first electrode EL1. Accordingly, the first light-emitting elements LD1 in the first emission component EMU1 can emit light of a first color (e.g., red light) with a luminance corresponding to a current distributed to each thereof. Also, the driving current flows into the first line LP1 of the second line area LA2 via the first conductive pattern CP1 through the first electrode EL1. The driving current supplied to the first line LP1 flows into a first electrode EL1 of each of the second and third emission components EMU2 and EMU3 through the fifth conductive pattern CP5 and the ninth conductive pattern CP9. The driving current flows into a fourth electrode EL4 of the corresponding emission component via the first light-emitting elements LD1 of the integrated light-emitting elements IT_LD through the first electrode EL1 of each of the second and third emission components EMU2 and EMU3. Accordingly, the first light-emitting elements LD1 in each of the second and third emission components EMU2 and EMU3 can emit the light of the first color (e.g., the red light) with the luminance corresponding to the current distributed to each thereof.

In case that a driving current is supplied to the second electrode EL2 of the first emission component EMU1 through the fifth via hole VIH5, the driving current flows into the fourth electrode EL4 via second light-emitting elements LD2 of the integrated light-emitting elements IT_LD through the second electrode EL2. Accordingly, the second light-emitting elements LD2 in the first emission component EMU1 can emit light of a second color (e.g., green light) with a luminance corresponding to a current distributed to each thereof. Also, the driving current flows into the second line LP2 of the first line area LA1 via the second conductive pattern CP2 through the second electrode EL2. The driving current supplied to the second line LP2 flows into a second electrode EL2 of each of the second and third emission components EMU2 and EMU3 through the sixth conductive pattern CP6 and the tenth conductive pattern CP10. The driving current flows into a fourth electrode of the corresponding emission component via the second light-emitting elements LD2 of the integrated light-emitting elements IT_LD through a second electrode EL2 of each of the second and third emission components EMU2 and EMU3. Accordingly, the second light-emitting elements LD2 in each of the second and third emission components EMU2 and EMU3 can emit the light of the second color (e.g., the green light) with the luminance corresponding to the current distributed to each thereof.

In case that a driving current is supplied to the third electrode EL3 of the third emission component EMU3 through the eleventh via hole VIH11, the driving current flows into the fourth electrode EL4 via third light-emitting elements LD3 of the integrated light-emitting elements IT_LD through the third electrode EL3. Accordingly, the third light-emitting elements LD3 in the third emission component EMU3 can emit light of a third color (e.g., blue light) with a luminance corresponding to a current distributed to each thereof. Also, the driving current flows into the third line LP3 of the first line area LA1 via the eleventh conductive pattern CP11 through the third electrode EL3. The driving current supplied to the third line LP3 flows into a third electrode EL3 of each of the first and second emission components EMU1 and EMU2 through the third conductive pattern CP3 and the seventh conductive pattern CP7. The driving current flows into a fourth electrode EL4 of the corresponding emission component via the third light-emitting elements LD3 of the integrated light-emitting elements IT_LD through the third electrode EL3 of each of the first and second emission components EMU1 and EMU2. Accordingly, the third light-emitting elements LD3 in each of the first and second emission components EMU1 and EMU2 can emit the light of the third color (e.g., the blue light) with the luminance corresponding to the current distributed to each thereof.

As described above, first to third light-emitting elements LD1, LD2, and LD3 of each of integrated light-emitting elements IT_LD in each of the first to third emission components EMU1, EMU2, and EMU3 can be concurrently (e.g., simultaneously) driven to emit light.

In accordance with the above-described embodiment, an integrated light-emitting element IT_LD may be formed, in which a first light-emitting element LD1 emitting light of a first color (or red light), a second light-emitting element LD2 emitting light of a second color (or green light), and a third light-emitting element LD3 emitting light of a third color (or blue light) are coupled to each other by using a shape memory polymer SMP. The integrated light-emitting element IT_LD may be mixed into a volatile ink to be concurrently (e.g., simultaneously) input (or supplied) once to each of the first to third emission areas EMA1, EMA2, and EMA3 by using an inkjet printing technique or the like. Specifically, the volatile ink in which the integrated light-emitting element IT_LD including the first light-emitting element LD1, the second light-emitting element LD2, and the third light-emitting element LD3 are mixed may be concurrently (e.g., simultaneously) supplied to each of the first to third emission areas EMA1, EMA2, and EMA3 through a nozzle of an inkjet printer. As compared with the existing display device in which a light-emitting element emitting light of the first color is supplied to the first emission area EMA1, a light-emitting element emitting light of the second color is supplied to the second emission area EMA2, and a light-emitting element emitting light of the third color is supplied to the third emission area EMA3, an alignment number of light-emitting elements is decreased (or an alignment degree of the light-emitting elements is increased), thereby improving the manufacturing efficiency of the display device DD.

In accordance with the above-described embodiment, as light of white is finally emitted from each integrated light-emitting element IT_LD aligned and located in each of the first to third emission areas EMA1, EMA2, and EMA3, a color conversion layer (e.g., a component for converting blue-based light into light of a specific color (e.g., red light or green light) in case that a light-emitting element aligned and located in an emission area emits the blue-based light) may be omitted. Accordingly, a manufacturing process of the color conversion layer is omitted, thereby further improving the manufacturing efficiency of the display device DD.

In one or more embodiments, at least one overcoat layer (e.g., a layer for planarizing a top surface of the display element layer DPL) may be further located on the top of the electrodes EL. In one or more embodiments, a color filter layer may be further located on the top of the display element layer DPL of each of the first to third sub-pixels SPX1, SPX2, and SPX3 (e.g., see FIG. 14).

Figure 14:
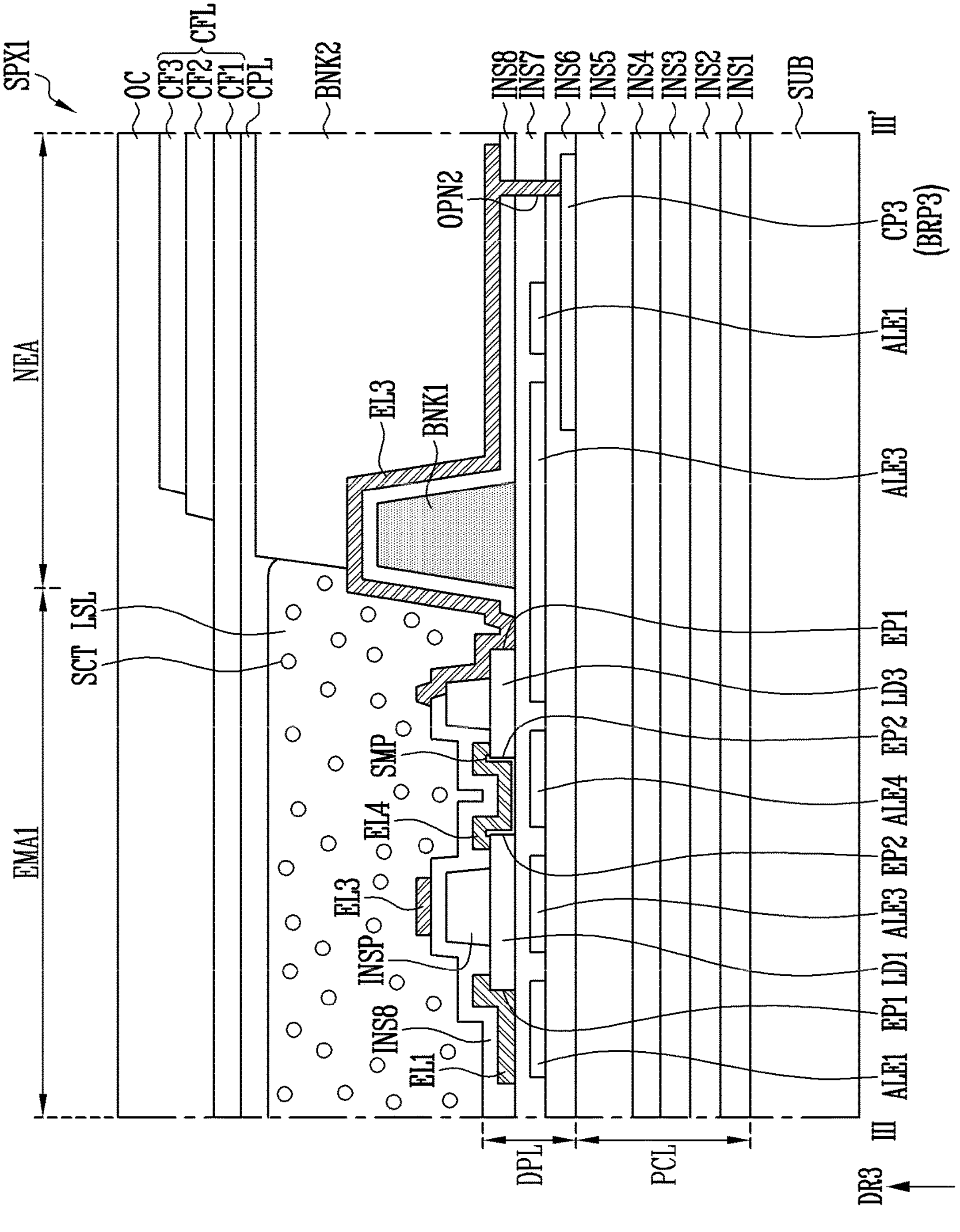
FIGS. 14 and 15 illustrate a first sub-pixel in accordance with one or more embodiments, and are schematic cross-sectional views corresponding to the line III-III' shown in FIG. 9.
Figure 15:
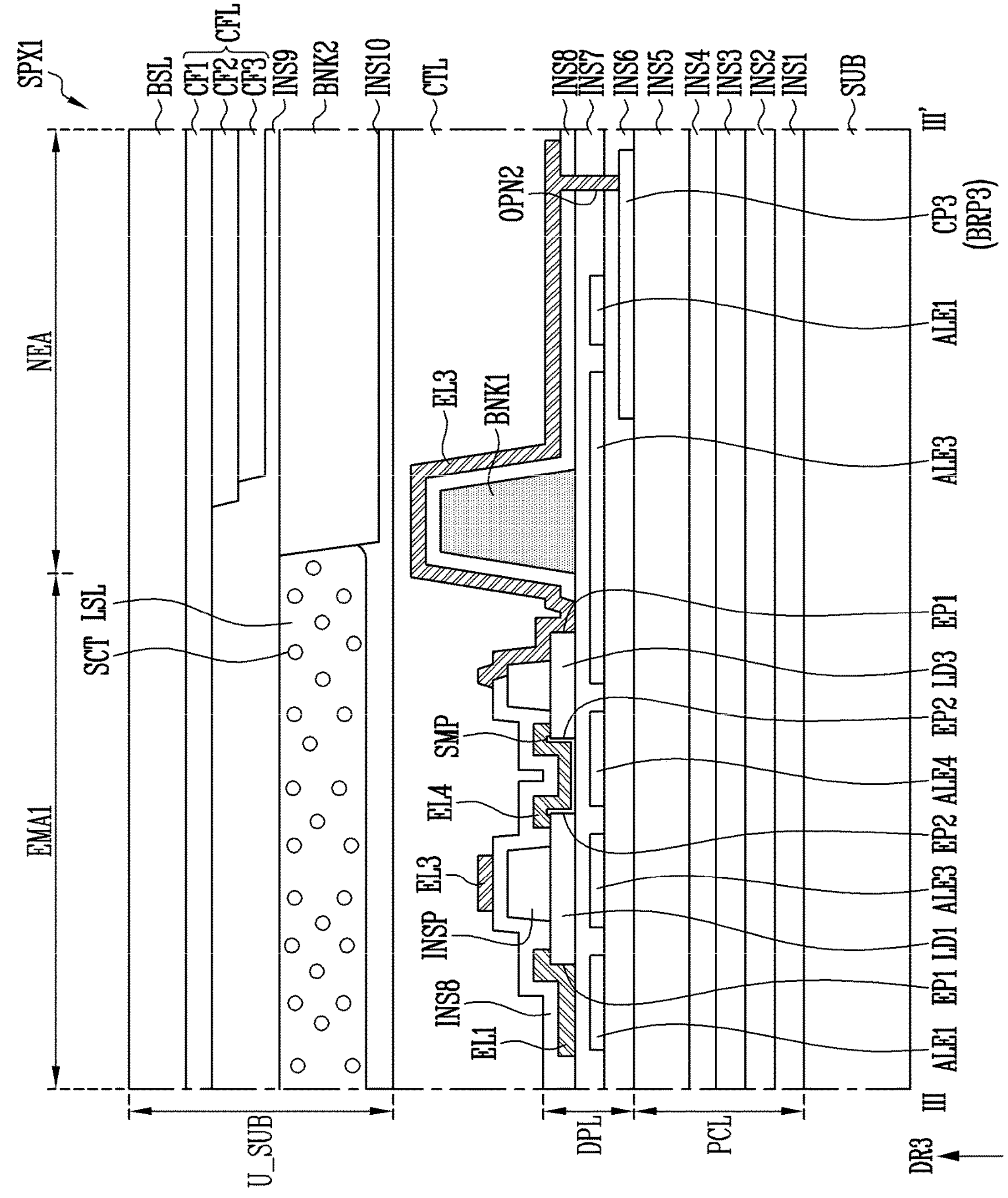

FIGS. 14 and 15 illustrate a first sub-pixel SPX1 in accordance with one or more embodiments, and are schematic cross-sectional views corresponding to the line III-III' shown in FIG. 9.

Embodiments shown in FIGS. 14 and 15 illustrate different modified examples in relation to a position of a light-scattering layer LSL. For example, one or more embodiments in which a light-scattering layer LSL and a color filter layer CFL are located on the top of a third electrode EL3 through a continuous process is disclosed in FIG. 14, and one or more embodiments in which an upper substrate U_SUB including a light-scattering layer LSL and a color filter layer CFL is located on the third electrode EL3 through an adhesion process using an intermediate layer CTL is disclosed in FIG. 15.

In relation to FIGS. 14 and 15, portions different from those of the above-described embodiments will be mainly described to avoid redundancy.

Referring to FIGS. 9 to 14, the first sub-pixel SPX1 may include an optical layer and an overcoat layer OC, which are located on the eighth insulating layer INS8 and the third electrode EL3. The optical layer may include a light-scattering layer LSL located on the third electrode EL3 to correspond to an integrated light-emitting element IT_LD in the first emission area EMA1 and a color filter layer CFL located on the light-scattering layer LSL. Also, the optical layer may include a second bank BNK2 that surrounds the light-scattering layer LSL and is located on the first bank BNK1 in the non-emission area NEA.

The second bank BNK2 may be located on the first bank BNK1 in the non-emission area NEA of the first sub-pixel SPX1. The second bank BNK2 may surround the first emission area EMA1 of the first sub-pixel SPX1, and define a position at which the light-scattering layer LSL is to be supplied.

The second bank BNK2 may include a light-blocking material. For example, the second bank BNK2 may be a black matrix, but the present disclosure is not limited thereto.

The light-scattering layer LSL may include light scattering particles SCT for scattering light of white, which is emitted from the integrated light-emitting element IT_LD, in various directions.

A capping layer CPL may be located over the light-scattering layer LSL and the second bank layer BNK2.

The capping layer CPL may be entirely provided in the first sub-pixel area SPXA1 (or the display area DA) in which the first sub-pixel SPX1 is located to cover the second bank BNK2 and the light-scattering layer LSL.

The capping layer CPL may be an inorganic layer including an inorganic material. The capping layer CPL may include at least one selected from among silicon nitride ($SiN_x$), silicon oxide ($SiO_x$), silicon oxynitride ($SiO_xN_y$), aluminum oxide ($AlO_x$), and/or the like. The capping layer CPL entirely covers the second bank BNK2 and the light-scattering layer LSL, thereby blocking external moisture, oxygen or the like from being introduced into the light-scattering layer LSL.

In one or more embodiments, the capping layer CPL may reduce a step difference occurring due to components located thereunder, and have a flat surface. For example, the capping layer CPL may be an organic layer including an organic material, but the present disclosure is not limited thereto. The capping layer CPL may be a common layer commonly provided in the display area DA.

The color filter layer CFL may be located on the capping layer CPL.

The color filter layer CFL may include a color filter corresponding to the first emission area EMA1. For example, the color filter layer CFL may include a first color filter CF1 located on the light-scattering layer LSL of the first sub-pixel SPX1, a second color filter CF2 located on a light-scattering layer LSL of the second sub-pixel SPX2, and a third color filter CF3 located on a light-scattering layer LSL of the third sub-pixel SPX3.

The first, second, and third color filters CF1, CF2, and CF3 may be located while overlapping with each other in the non-emission area NEA, to be used as a light-blocking material for blocking light interference between adjacent sub-pixels. Each of the first, second, and third color filters CF1, CF2, and CF3 may include a color filter material for allowing light of a specific wavelength band in the light of white, which passes through a corresponding light-scattering layer, to be selectively transmitted therethrough. For example, the first color filter CF1 may be a red color filter, the second color filter CF2 may be a green color filter, and the third color filter CF3 may be a blue color filter. However, the present disclosure is not limited thereto.

The overcoat layer OC may be located over the color filter layer CFL.

The overcoat layer OC may be an inorganic insulating layer including an inorganic material or an organic insulating layer including an organic material. The overcoat layer OC may entirely cover components located thereunder, thereby blocking moisture, humidity or the like from being introduced into the optical layer from the outside. In one or more embodiments, the overcoat layer OC may be used as a planarization layer for reducing a step difference occurring due to components of the optical layer, which are located thereunder.

The overcoat layer OC may be formed as a multi-layer. For example, the overcoat layer OC may include at least two inorganic insulating layers and at least one organic insulating layer interposed between the at least two inorganic insulating layers. However, the material and/or structure of the overcoat layer OC may be variously changed. In one or more embodiments, at least one overcoat layer, at least one filler layer, and/or another substrate may be further located on the top of the overcoat layer OC.

In one or more embodiments, as shown in FIG. 15, the light-scattering layer LSL and the color filter layer CFL may be formed on one surface of a base layer BSL through a continuous process, to constitute a separate substrate, e.g., an upper substrate U_SUB. The upper substrate U_SUB may be bonded to the display element layer DPL in which the third electrode EL3, the eighth insulating layer INS8, and the like are located through an intermediate layer CTL.

The intermediate layer CTL may be a transparent adhesive layer (or cohesive layer), e.g., optically clear adhesive for reinforcing adhesion between the substrate SUB and the upper substrate U_SUB, but the present disclosure is not limited thereto. In one or more embodiments, the intermediate layer CTL may be a refractive index conversion layer for converting a refractive index of light which is emitted from the integrated light-emitting element IT_LD and then advances toward the upper substrate U_SUB, thereby improving the light-emitting luminance of the first sub-pixel SPX1. In one or more embodiments, the intermediate layer CTL may include a filler configured with an insulating material having insulative and adhesive properties.

The upper substrate U_SUB may include the base layer BSL, a color filter layer CFL, a ninth insulating layer INS9, a light-scattering layer LSL, and a tenth insulating layer INS10, which are stacked in the opposite direction of the third direction DR3. Also, the upper substrate U_SUB may include a second bank BNK2 surrounding the light-scattering layer LSL.

The base layer BSL may be a rigid substrate or a flexible substrate, and the material and property of the base layer BSL are not particularly limited. The base layer BSL may be configured with the same material as the substrate SUB, or may be configured with a material different from the material of the substrate SUB.

The color filter layer CFL may be located on one surface of the base layer BSL to face the integrated light-emitting element IT_LD. A first color filter CF1 of the color filter layer CFL may be provided on the one surface of the base layer BSL to correspond to the integrated light-emitting element IT_LD in the first emission area EMA1. First, second, and third color filters CF1, CF2, and CF3 of the color filter layer CFL may be located in the non-emission area NEA to overlap with each other. Therefore, the first, second, and third color filters CF1, CF2, and CF3 of the color filter layer CFL may be used as a light-blocking member.

The ninth insulating layer INS9 may be located over the color filter layer CFL. The ninth insulating layer INS9 may be located over the color filter layer CFL, thereby covering the color filter layer CFL. Thus, the ninth insulating layer INS9 can protect the color filter layer CFL. The ninth insulating layer INS9 may be an inorganic insulating layer including an inorganic material or an organic insulating layer including an organic material.

The second bank BNK2 and the light-scattering layer LSL may be located on the ninth insulating layer INS9.

The tenth insulating layer INS10 may be entirely located over the second bank BNK2 and the light-scattering layer LSL.

The tenth insulating layer INS10 may be configured as an inorganic insulating layer including an inorganic material or may be configured as an organic insulating layer including an organic material. The tenth insulating layer INS10 is located over the light-scattering layer LSL, thereby protecting the light-scattering layer LSL from external moisture, external humidity, and the like. Thus, the reliability of the light-scattering layer LSL can be further improved.

The above-described upper substrate U_SUB may be bonded to the display element layer DPL by using the intermediate layer CTL.

Figure 16:
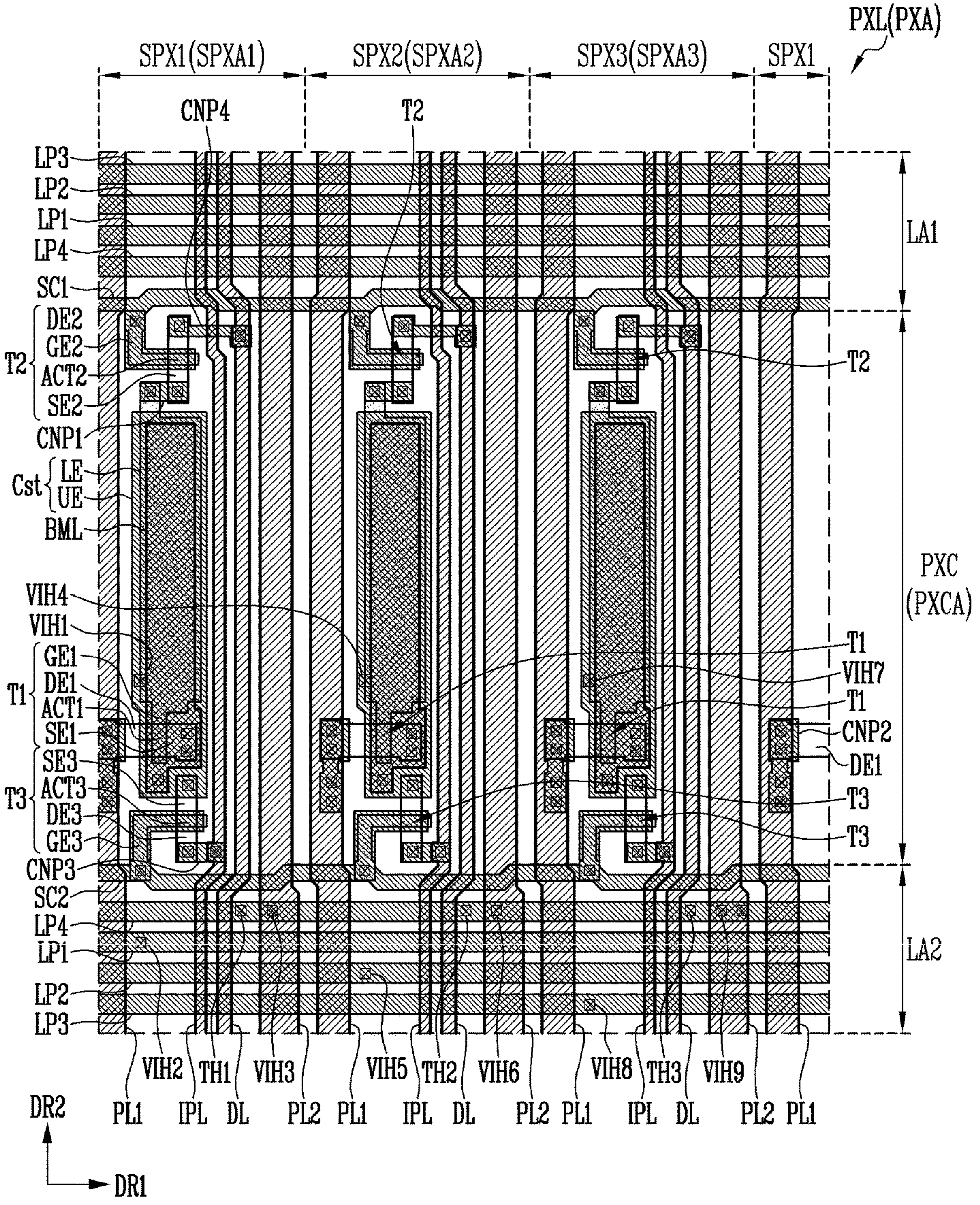
FIG. 16 is a schematic plan view illustrating a pixel area including a pixel circuit layer of a pixel in accordance with one or more embodiments.
Figure 17:
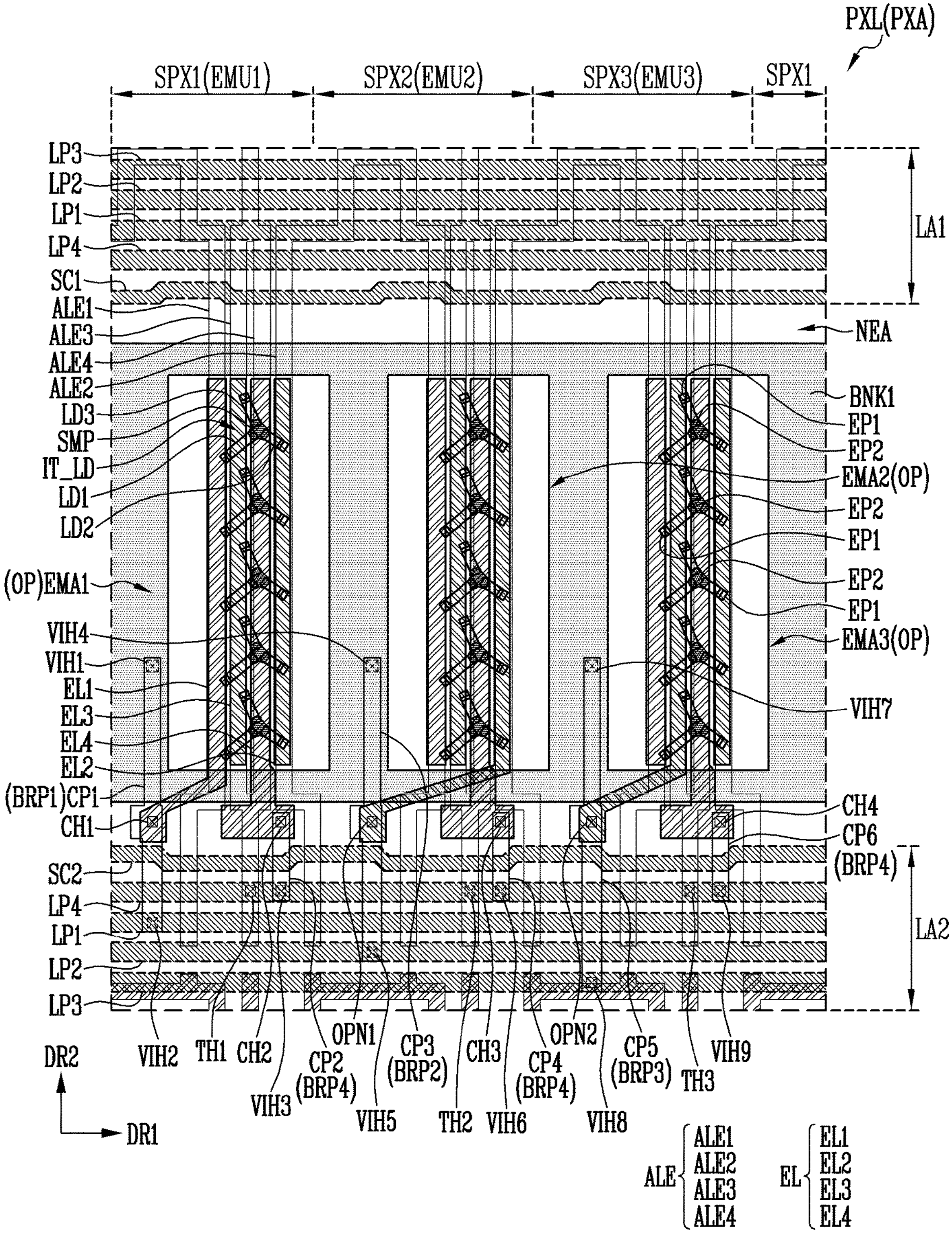
FIG. 17 is a schematic plan view illustrating a pixel area including a display element layer of a pixel in accordance with one or more embodiments.

FIG. 16 is a schematic plan view illustrating a pixel area PXA including a pixel circuit layer of a pixel PXL in accordance with one or more embodiments. FIG. 17 is a schematic plan view illustrating a pixel area PXL including a display element layer of a pixel PXL in accordance with one or more embodiments.

In relation to FIGS. 16 and 17, portions different from those of the above-described embodiments will be mainly described to avoid redundancy.

Referring to FIGS. 16 and 17, a pixel in accordance with one or more embodiments of the present disclosure may include a first sub-pixel SPX1, a second sub-pixel SPX2, and a third sub-pixel SPX3. Each of the first to third sub-pixels SPX1, SPX2, and SPX3 may include a pixel circuit PXC and an emission component electrically connected to the pixel circuit PXC.

A storage capacitor Cst of the first sub-pixel SPX1 may include a lower electrode LE and an upper electrode UE. The upper electrode UE may be electrically connected to a first conductive pattern CP1 of a first emission component EMU1 through a first via hole VIH1.

The first conductive pattern CP1 may be electrically connected to the upper electrode UE of the first sub-pixel SPX1 through the first via hole VIH1. The first conductive pattern CP1 may be electrically connected to a first line LP1 located in the second line area LA2 through a second via hole VIH2. The first conductive pattern CP1 may be electrically connected to a first electrode EL1 of the first emission component EMU1 through a first contact hole CH1. In one or more embodiments, the first conductive pattern CP1 may be a first bridge pattern BRP1 electrically connecting the first electrode EL1 and the first line LP1 to each other.

As described above, the upper electrode UE of the first sub-pixel SPX1, the first line LP1, and the first electrode EL1 may be electrically connected to each other through the first conductive pattern CP1.

A storage capacitor Cst of the second sub-pixel SPX2 may include a lower electrode LE and an upper electrode UE. The upper electrode UE may be electrically connected to a third conductive pattern CP3 of a second emission component EMU2 through a fourth via hole VIH4.

The third conductive pattern CP3 may be electrically connected to the upper electrode UE of the second sub-pixel SPX2 through the fourth via hole VIH4. The third conductive pattern CP3 may be electrically connected to a second line LP2 located in the second line area LA2 through a fifth via hole VIH5. The third conductive pattern CP3 may be electrically connected to a second electrode EL2 of the second emission component EMU2 through a first opening OPN1. In one or more embodiments, the third conductive pattern CP3 may be a second bridge pattern BRP2 electrically connecting the second electrode EL2 and the second line LP2 to each other.

As described above, the upper electrode UE of the second sub-pixel SPX2, the second line LP2, and the second electrode EL2 may be electrically connected to each other through the third conductive pattern CP3.

A storage capacitor Cst of the third sub-pixel SPX3 may include a lower electrode LE and an upper electrode UE. The upper electrode UE may be electrically connected to a fifth conductive pattern CP5 of a third emission component EMU3 through a seventh via hole VIH7.

The fifth conductive pattern CP5 may be electrically connected to the upper electrode UE of the third sub-pixel SPX3 through the seventh via hole VIH7. The fifth conductive pattern CP5 may be electrically connected to a third line LP3 located in the second line area LA2 through an eighth via hole VIH8. The fifth conductive pattern CP5 may be electrically connected to a third electrode EL3 of the third emission component EMU3 through a second opening OPN2. In one or more embodiments, the fifth conductive pattern CP5 may be a third bridge pattern BRP3 electrically connecting the third electrode EL3 and the third line LP3 to each other.

As described above, the upper electrode UE of the third sub-pixel SPX3, the third line LP3, and the third electrode EL3 may be electrically connected to each other through the fifth conductive pattern CP5.

A fourth electrode EL4 of the first emission component EMU1 may be electrically connected to a second conductive pattern CP2 through a second contact hole CH2. One end of the second conductive pattern CP2 may be electrically connected to the fourth electrode EL4 through the second contact hole CH2. The other end of the second conductive pattern CP2 may be electrically connected to a fourth line LP4 located in the second line area LA2 through a third via hole VIH3.

A fourth electrode EL4 of the second emission component EMU2 may be electrically connected to a fourth conductive pattern CP4 through a third contact hole CH3. One end of the fourth conductive pattern CP4 may be electrically connected to the fourth electrode EL4 through the third contact hole CH3. The other end of the fourth conductive pattern CP4 may be electrically connected to the fourth line LP4 located in the second line area LA2 through a sixth via hole VIH6.

A fourth electrode EL4 of the third emission component EMU3 may be electrically connected to a sixth conductive pattern CP6 through a fourth contact hole CH4. One end of the sixth conductive pattern CP6 may be electrically connected to the fourth electrode EL4 through the fourth contact hole CH4. The other end of the sixth conductive pattern CP6 may be electrically connected to the fourth line LP4 located in the second line area LA2 through a ninth via hole VIH9.

In one or more embodiments, each of the second conductive pattern CP2, the fourth conductive pattern CP4, and the sixth conductive pattern CP6 may be a fourth bridge pattern BRP4 electrically connecting the fourth electrode EL4 of each of the first to third sub-pixels SPX1, SPX2, and SPX3 and the fourth line LP4 to each other.

A second electrode EL2 of the first emission component EMU1 (or the first sub-pixel SPX1) may be in direct contact with a first end portion EP1 of a second light-emitting element LD2 of an integrated light-emitting element IT_LD, but may not be electrically connected to the first to fourth lines LP1 to LP4. That is, the second electrode EL2 may be a floating electrode that is not supplied with any signal from the outside.

A third electrode EL3 of the first emission component EMU1 (or the first sub-pixel SPX1) may be in direct contact with a first end portion EP1 of a third light-emitting element LD3 of the integrated light-emitting element IT_LD, but may not be electrically connected to the first to fourth lines LP1 to LP4. That is, the third electrode EL3 may be a floating electrode that is not supplied with any signal from the outside.

A first electrode EL1 of the second emission component EMU2 (or the second sub-pixel SPX2) may be in direct contact with a first end portion EP1 of the first light-emitting element LD1 of an integrated light-emitting element IT_LD, but may not be electrically connected to the first to fourth lines LP1 to LP4. That is, the first electrode EL1 may be a floating electrode which is not supplied with any signal from the outside.

A third electrode EL3 of the second emission component EMU2 (or the second sub-pixel SPX2) may be in direct contact with a first end portion EP1 of a third light-emitting element LD3 of the integrated light-emitting element IT_LD, but may not be electrically connected to the first to fourth lines LP1 to LP4. That is, the third electrode EL3 may be a floating electrode that is not supplied with any signal from the outside.

A first electrode EL1 of the third emission component EMU3 (or the third sub-pixel SPX3) may be in direct contact with a first end portion EP1 of a first light-emitting element LD1 of an integrated light-emitting element IT_LD, but may not be electrically connected to the first to fourth lines LP1 to LP4. That is, the third electrode EL3 may be a floating electrode that is not supplied with any signal from the outside.

A second electrode EL2 of the third emission component EMU3 (or the third sub-pixel SPX3) may be in direct contact with a first end portion EP1 of a second light-emitting element LD2 of the integrated light-emitting element IT_LD, but may not be electrically connected to the first to fourth lines LP1 to LP4. That is, the second electrode EL2 may be a floating electrode that is not supplied with any signal from the outside.

In the above-described embodiment, in case that a driving current flows from a first power line PL1 to a second power line PL2 by means of a first transistor T1 in a pixel circuit PXC of each of the first to third sub-pixels SPX1, SPX2, and SPX3, the driving current may be introduced to each of the first, second, and third emission components EMU1, EMU2, and EMU3 through each of the first via hole VIH1, the fourth via hole VIH4, and the seventh via hole VIH7.

In case that a driving current is supplied to the first electrode EL1 of the first emission component EMU1 through the first via hole VIH1, the driving current flows into the fourth electrode EL4 via first light-emitting elements LD1 of integrated light-emitting elements IT_LD through the first electrode EL1. Accordingly, the first light-emitting elements LD1 in the first emission component EMU1 can emit light of a first color (e.g., red light) with a luminance corresponding to a current distributed to each thereof. In the first emission component EMU1, only the first light-emitting elements LD1 may be driven to emit light of the first color.

In case that a driving current is supplied to the second electrode EL2 of the second emission component EMU2 through the fourth via hole VIH4, the driving current flows into the fourth electrode EL4 via second light-emitting elements LD2 of integrated light-emitting elements IT_LD through the second electrode EL2. Accordingly, the second light-emitting elements LD2 in the second emission component EMU2 can emit light of a second color (e.g., green light) with a luminance corresponding to a current distributed to each thereof. In the second emission component EMU2, only the second light-emitting elements LD2 may be driven to emit light of the second color.

In case that a driving current is supplied to the third electrode EL2 of the third emission component EMU3 through the seventh via hole VIH7, the driving current flows into the fourth electrode EL4 via third light-emitting elements LD3 of integrated light-emitting elements IT_LD through the third electrode EL3. Accordingly, the third light-emitting elements LD3 in the third emission component EMU3 can emit light of a third color (e.g., blue light) with a luminance corresponding to a current distributed to each thereof. In the third emission component EMU3, only the third light-emitting elements LD3 may be driven to emit light of the third color.

As described above, the first light-emitting elements LD1 are driven to emit light in the first emission component EMU1 (or the first sub-pixel SPX1), the second light-emitting elements LD2 are driven to emit light in the second emission component EMU2 (or the second sub-pixel SPX2), and the third light-emitting elements LD3 are driven to emit light in the third emission component EMU3 (or the third sub-pixel SPX3. Thus, white light can be finally emitted in each pixel PXL.

In accordance with the present disclosure, an integrated light-emitting element is formed in which a first light-emitting element, a second light-emitting element, and a third light-emitting element are coupled to each other by using a shape memory polymer. The integrated light-emitting element is aligned in each sub-pixel through a one-time inkjet process, thereby an alignment number of light-emitting elements. Thus, the manufacturing efficiency of the display device can be improved.

In accordance with the present disclosure, white light is finally emitted in the integrated light-emitting element, so that a color conversion layer for each sub-pixel is omitted. Thus, the manufacturing efficiency of the display device can be further improved.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising:

pixels comprising a first sub-pixel, a second sub-pixel, and a third sub-pixel adjacent to each other, wherein the first to third sub-pixels comprise:

a first electrode, a second electrode, a third electrode, and a fourth electrode spaced from each other; and an integrated light-emitting element electrically connected to the first to fourth electrodes, and wherein the integrated light-emitting element comprises:

a first light-emitting element comprising a first end portion electrically connected to the first electrode, and a second end portion electrically connected to the fourth electrode;

a second light-emitting element comprising a first end portion electrically connected to the second electrode, and a second end portion electrically connected to the fourth electrode;

a third light-emitting element comprising a first end portion electrically connected to the third electrode, and a second end portion electrically connected to the fourth electrode; and a shape memory polymer coupled to the second end portions of the first to third light-emitting elements.

2. The display device of claim 1, further comprising:

a first line extending in a first direction, the first line being electrically connected to the first electrode;

a second line extending in the first direction, the second line being electrically connected to the second electrode;

a third line extending in the first direction, the third line being electrically connected to the third electrode; and a fourth line extending in the first direction, the fourth line being electrically connected to the fourth electrode, wherein the first line, the second line, the third line, and the fourth line are spaced from each other.

3. The display device of claim 2, further comprising:

a first bridge pattern electrically connecting the first electrode and the first line to each other;

a second bridge pattern electrically connecting the second electrode and the second line to each other;

a third bridge pattern electrically connecting the third electrode and the third line to each other; and a fourth bridge pattern electrically connecting the fourth electrode and the fourth line to each other.

4. The display device of claim 3, wherein the fourth line is configured to receive a low potential voltage.

5. The display device of claim 3, wherein the first electrode of the first sub-pixel, the first electrode of the second sub-pixel, and the first electrode of the third sub-pixel are electrically connected to each other through the first line, wherein the second electrode of the first sub-pixel, the second electrode of the second sub-pixel, and the second electrode of the third sub-pixel are electrically connected to each other through the second line, wherein the third electrode of the first sub-pixel, the third electrode of the second sub-pixel, and the third electrode of the third sub-pixel are electrically connected to each other through the third line, and wherein the fourth electrode of the first sub-pixel, the fourth electrode of the second sub-pixel, and the fourth electrode of the third sub-pixel are electrically connected to each other through the fourth line.

6. The display device of claim 3, wherein the first to third sub-pixels comprise a pixel circuit having a transistor electrically connected to the integrated light-emitting element, and a storage capacitor electrically connected to the transistor, and wherein the storage capacitor is electrically connected to a corresponding bridge pattern from among the first to fourth bridge patterns.

7. The display device of claim 6, wherein the storage capacitor of the first sub-pixel is electrically connected to the first line through the first bridge pattern, wherein the storage capacitor of the second sub-pixel is electrically connected to the second line through the second bridge pattern, and wherein the storage capacitor of the third sub-pixel is electrically connected to the third line through the third bridge pattern.

8. The display device of claim 6, wherein the first to third sub-pixels further comprise:

a pixel circuit area, the pixel circuit being in the pixel circuit area;

a first line area at an upper side of the pixel circuit area;

a second line area at a lower side of the pixel circuit area; and a first alignment electrode, a second alignment electrode, a third alignment electrode, and a fourth alignment electrode spaced from each other, and at a layer between the first to fourth bridge patterns and the first to fourth electrodes.

9. The display device of claim 8, wherein the first to fourth lines comprise a first set of first to fourth lines, the display device further comprising a second set of first to fourth lines, wherein the first set of the first to fourth lines are in the first line area, wherein the second set of the first to fourth lines are in the second line area, and wherein arrangements of the first set of the first to fourth lines in the first line area and of the second set of the first to fourth lines in the second line area are symmetrical to each other with the pixel circuit area therebetween.

10. The display device of claim 1, wherein the first to third sub-pixels further comprise:

an emission area, and a non-emission area around the emission area, the light from the integrated light-emitting element being emitted in the emission area;

a first bank in the non-emission area, the first bank comprising an opening area corresponding to the emission area;

a second bank above the first bank;

a light-scattering layer above the integrated light-emitting element, and surrounded by the second bank; and a color filter above the light-scattering layer.

11. The display device of claim 1, wherein the first light-emitting element is configured to emit light of a first color, wherein the second light-emitting element is configured to emit light of a second color that is different from the light of the first color, and wherein the third light-emitting element is configured to emit light of a third color that is different from the light of the first color and the light of the second color.

12. The display device of claim 11, wherein the light of the first color is red light, the light of the second color is green light, and the light of the third color is blue light.

13. The display device of claim 1, wherein the first electrode and the fourth electrode are at a same layer, and wherein the second electrode and the third electrode are at a same layer.

14. The display device of claim 1, wherein one light-emitting element from among the first to third light-emitting elements is longer the other two light-emitting elements from among the first to third light-emitting elements.

15. The display device of claim 2, wherein the first to third sub-pixels comprise a pixel circuit having a transistor electrically connected to the integrated light-emitting element, and a storage capacitor electrically connected to the transistor, and wherein the display device further comprises:

a first bridge pattern electrically connecting the storage capacitor of the first sub-pixel and the first line to each other;

a second bridge pattern electrically connecting the storage capacitor of the second sub-pixel and the second line to each other;

a third bridge pattern electrically connecting the storage capacitor of the third sub-pixel and the third line to each other; and a fourth bridge pattern electrically connecting the fourth electrode of each of the first to third sub-pixels to the fourth line.

16. The display device of claim 15, wherein the first bridge pattern electrically connects the first electrode of the first sub-pixel and the first line to each other, wherein the second bridge pattern electrically connects the second electrode of the second sub-pixel and the second line to each other, and wherein the third bridge pattern electrically connects the third electrode of the third sub-pixel and the third line to each other.

17. The display device of claim 15, wherein the fourth line is configured to receive a low potential voltage.

18. A display device comprising:

pixels comprising a first sub-pixel, a second sub-pixel, and a third sub-pixel arranged adjacent to each other above a substrate, wherein the first to third sub-pixels comprise:

a pixel circuit having a transistor, and a storage capacitor electrically connected to the transistor;

an integrated light-emitting element electrically connected to the pixel circuit;

a first electrode, a second electrode, a third electrode, and a fourth electrode electrically connected to the integrated light-emitting element, the first to fourth electrodes being spaced from each other;

a first line extending in one direction, and electrically connected to the storage capacitor of the first sub-pixel and the first electrode;

a second line extending in the one direction, and electrically connected to the storage capacitor of the second sub-pixel and the second electrode;

a third line extending in the one direction, and electrically connected to the storage capacitor of the third sub-pixel and the third electrode; and a fourth line extending in the one direction, and electrically connected to the fourth electrode of each of the first to third sub-pixels, and wherein the integrated light-emitting element comprises a first light-emitting element configured to emit light of a first color, a second light-emitting element configured to emit light of a second color that is different from the light of the first color, a third light-emitting element configured to emit light of a third color that is different from the light of the second color, and a shape memory polymer coupled to the first to third light-emitting elements.

19. The display device of claim 18, wherein the fourth line is configured to receive a low potential voltage, wherein the first light-emitting element comprises a first end portion electrically connected the first electrode, and a second end portion electrically connected to the fourth electrode, wherein the second light-emitting element comprises a first end portion electrically connected to the second electrode, and a second end portion electrically connected to the fourth electrode, wherein the third light-emitting element comprises a first end portion electrically connected to the third electrode, and a second end portion electrically connected to the fourth electrode, and wherein the second end portion of each of the first to third light-emitting elements is coupled to the shape memory polymer.

20. The display device of claim 19, wherein the second electrode and the third electrode in the first sub-pixel are floated, wherein the first electrode and the third electrode in the second sub-pixel are floated, and wherein the first electrode and the second electrode in the third sub-pixel are floated.

* * * * *